United States Patent
Nakatake et al.

(10) Patent No.: US 7,948,277 B2
(45) Date of Patent: May 24, 2011

(54) DRIVE CIRCUIT FOR SEMICONDUCTOR ELEMENT

(75) Inventors: Hiroshi Nakatake, Tokyo (JP); Satoshi Ishibashi, Tokyo (JP); Shinsuke Idenoue, Tokyo (JP); Takeshi Oi, Tokyo (JP); Shinichi Kinouchi, Tokyo (JP); Takeshi Horiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 266 days.

(21) Appl. No.: 12/294,437

(22) PCT Filed: Apr. 4, 2007

(86) PCT No.: PCT/JP2007/057536
§ 371 (c)(1),
(2), (4) Date: Sep. 25, 2008

(87) PCT Pub. No.: WO2007/116900
PCT Pub. Date: Oct. 18, 2007

(65) Prior Publication Data
US 2010/0231269 A1    Sep. 16, 2010

(30) Foreign Application Priority Data

Apr. 6, 2006  (JP) ................................ 2006-104907

(51) Int. Cl.
*H03K 3/00* (2006.01)
(52) U.S. Cl. ...................................................... 327/109
(58) Field of Classification Search .................. None
See application file for complete search history.

(56) References Cited

U.S. PATENT DOCUMENTS

| | | | | |
|---|---|---|---|---|
| 5,710,508 A * | 1/1998 | Watanabe | ...................... | 323/284 |
| 5,955,792 A * | 9/1999 | Fischer et al. | ................... | 307/87 |
| 6,150,853 A * | 11/2000 | Chrappan et al. | ............. | 327/108 |
| 6,661,260 B2 * | 12/2003 | Nakahara et al. | ............. | 327/109 |
| 6,717,785 B2 * | 4/2004 | Fukuda et al. | ............... | 361/93.1 |
| 6,906,574 B2 * | 6/2005 | Ohi et al. | ....................... | 327/392 |
| 7,741,894 B2 * | 6/2010 | Kojima | .......................... | 327/427 |
| 2003/0180997 A1 * | 9/2003 | Nakayama et al. | ........... | 438/200 |
| 2004/0027762 A1 * | 2/2004 | Ohi et al. | ....................... | 361/100 |

FOREIGN PATENT DOCUMENTS

| JP | 2003 284318 | 10/2003 |
|---|---|---|
| JP | 2004 64930 | 2/2004 |

* cited by examiner

*Primary Examiner* — Lincoln Donovan
*Assistant Examiner* — Khareem E Almo
(74) *Attorney, Agent, or Firm* — Oblon, Spivak, McClelland, Maier & Neustadt, L.L.P.

(57) ABSTRACT

A drive circuit wherein any abnormality of a semiconductor element is prevented from being erroneously sensed in a case where a gate "ON" command has entered in a state in which a gate voltage of the semiconductor element has not lowered fully. A detection process for a controlled variable of the semiconductor element is permitted only within a period which corresponds to a controlled variable of the semiconductor element at the time when an "ON" signal has been inputted to a control circuit, and a detected controlled variable which is detected within the period and a comparison controlled variable which is set in correspondence with the controlled variable are compared so as to output an abnormality signal, whereby the semiconductor element is turn-off at a speed lower than in normal turn-off.

21 Claims, 24 Drawing Sheets

REFERENCE VOLTAGE (GATE VOLTAGE)

DRIVE CIRCUIT FOR SEMICONDUCTOR ELEMENT

TECHNICAL FIELD

This invention relates to a drive circuit for a semiconductor element sensing the occurrence of any abnormality in the semiconductor element, and more particularly to a drive circuit for a power semiconductor element.

BACKGROUND ART

As a related-art drive circuit for a power semiconductor element (IGBT), there has been disclosed a technique wherein, during a period for which a sampling circuit permits a detection process for a gate voltage, the gate voltage is detected, and when the gate voltage exceeds a reference value, the occurrence of any abnormality in the IGBT is concluded (refer to, for example, Patent Document 1).
Patent Document 1: JP-A-2004-064930 (Lines 31-37 on page 7, FIG. 1)

DISCLOSURE OF THE INVENTION

Problem that the Invention is to Solve

However, the drive circuit for the power semiconductor element as disclosed in Patent Document 1 has had the problem that, in a case where the next "ON" pulse has entered in a state in which the gate voltage of the power semiconductor element (IGBT) has not lowered fully, the gate voltage exceeds the reference value, so the abnormality is erroneously sensed.

This invention has been made in order to solve the problem as stated above, and it has for its object to prevent the abnormality of a semiconductor element from being erroneously sensed, in a case where a gate "ON" command has entered in a state in which the gate voltage of the semiconductor element has not lowered fully.

Means for Solving the Problem

A drive circuit for a semiconductor element according to this invention includes a control circuit which turns "ON" and "OFF" the semiconductor element in correspondence with "ON" and "OFF" signals from outside, respectively; a sampling circuit which permits a detection process for a controlled variable of the semiconductor element, only within a period that corresponds to a controlled variable Qon of the semiconductor element at a time point when the control circuit has inputted the "ON" signal; and a controlled-variable detection circuit which compares a controlled variable Qt of the semiconductor element as is detected within the period permitted by said sampling circuit, and a controlled-variable comparison value Qs that is set beforehand, thereby to output an abnormality occurrence signal for the semiconductor element.

Besides, a drive circuit for a semiconductor element according to this invention includes a control circuit which turns "ON" and "OFF" the semiconductor element in correspondence with "ON" and "OFF" signals from outside, respectively; a sampling circuit which permits a detection process for a controlled variable of the semiconductor element, only within a preset period; and a controlled-variable detection circuit which compares a controlled variable Qt of the semiconductor element as is detected within the period permitted by said sampling circuit, and a controlled-variable comparison value Qs that is set in correspondence with a controlled variable Qon of the semiconductor element at a time point when the control circuit has inputted the "ON" signal, thereby to output an abnormality occurrence signal for the semiconductor element.

Further, a drive circuit for a semiconductor element according to this invention includes a control circuit which turns "ON" and "OFF" the semiconductor element in correspondence with "ON" and "OFF" signals from outside, respectively; a gate charge detection circuit which detects a gate charge quantity of the semiconductor element; a sampling circuit which permits a detection process for a controlled variable of the semiconductor element, only within a period when the gate charge quantity detected by the gate charge detection circuit is less than or equal to a predetermined value; and a controlled-variable detection circuit which compares a controlled variable Qt of the semiconductor element as is detected within the period permitted by the sampling circuit, and a controlled-variable comparison value Qs that is set between a controlled variable at a time when the semiconductor element lies in a mirror period and a controlled variable at a time when the semiconductor element is "ON", thereby to output an abnormality occurrence signal for the semiconductor element.

ADVANTAGE OF THE INVENTION

In accordance with a driver circuit for a semiconductor element according to this invention, the occurrence of any abnormality can be sensed without erroneously sensing the abnormality of the semiconductor element even in a case where an "ON" signal has been inputted in a state in which the gate voltage of the semiconductor element has not fallen fully.

BEST MODE FOR CARRYING OUT THE INVENTION

Now, the best mode for carrying out this invention will be described in conjunction with the drawings.

Embodiment 1

Now, Embodiment 1 of this invention will be described in conjunction with the drawings.

Figure 1:
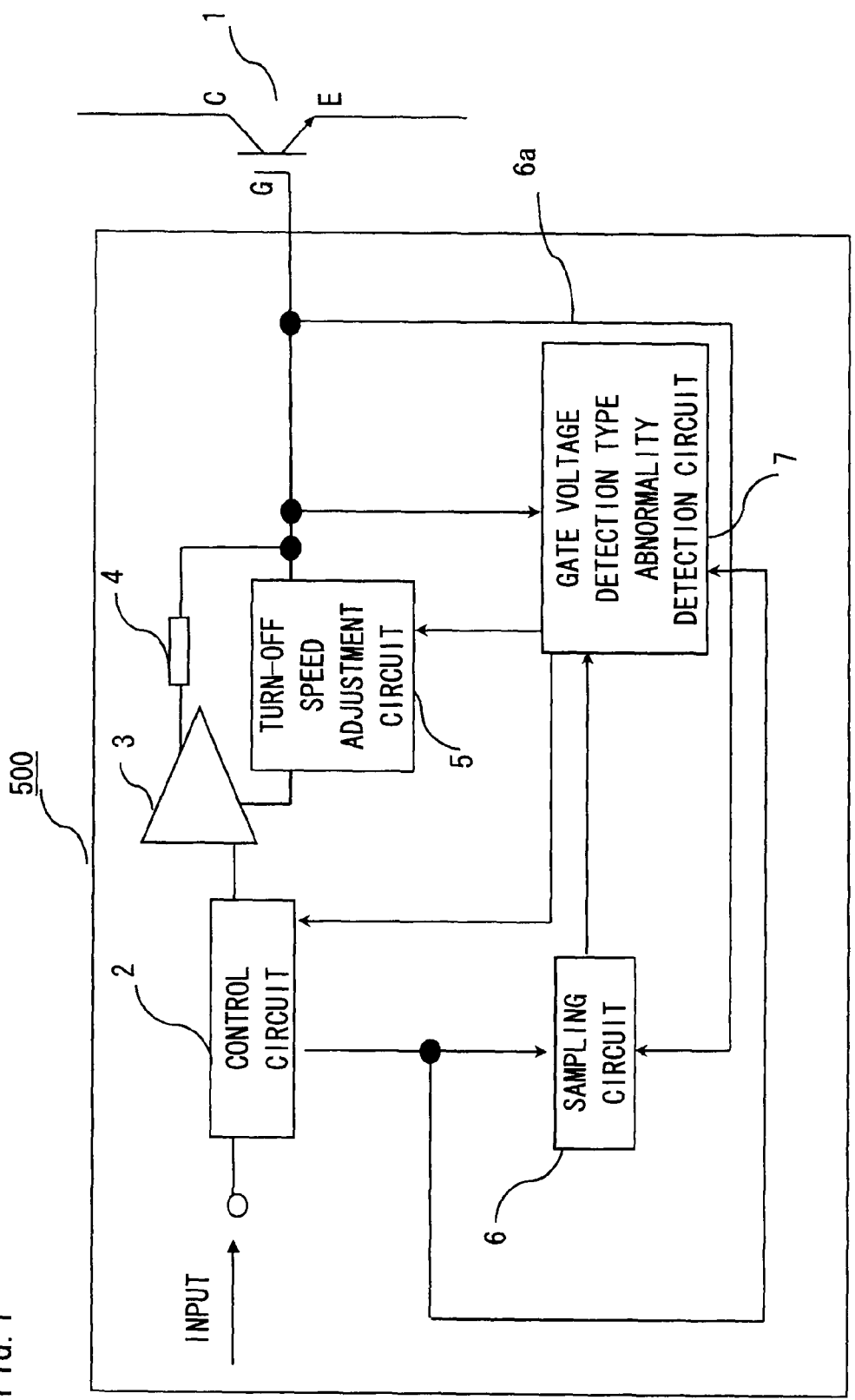
[FIG. 1] It is a configuration diagram showing a drive circuit for a power semiconductor element according to Embodiment 1 of this invention.

FIG. 1 is a configuration diagram showing a drive circuit 500 for a semiconductor element in Embodiment 1.

Referring to FIG. 1, the semiconductor element 1 is, for example, an IGBT (Insulated Gate Bipolar Transistor) which is a power semiconductor element. However, the semiconductor element 1 is not restricted to the IGBT, but it may be a voltage-driven semiconductor element, for example, a MOSFET, and it may be a semiconductor element which requires abnormality sensing.

A control circuit 2 outputs a gate command for turning "ON" the IGBT 1, to a buffer 3 when an "ON" command is inputted from outside, and it outputs a gate command for turning "OFF" the IGBT 1, to the buffer 3 when an "OFF" command is inputted from outside. The buffer 3 drives the IGBT 1 in accordance with the gate command outputted from the control circuit 2, and a gate resistor 4 and a turn-off speed adjustment circuit 5 are connected thereto. The turn-off speed adjustment circuit 5 has the function of making a turn-off speed lower in case of turning "OFF" the IGBT 1 with the sensing of the occurrence of any abnormality, than in case of turning "OFF" the IGBT 1 with the input of the "OFF" command from the control circuit 2. Here, the turn-off speed adjustment circuit 5 is furnished with the above function, for the following reason: When the IGBT 1 is turn off at the ordinary speed in the abnormal mode where a large current is flowing through the IGBT 1 due to, for example, a short-circuiting state, a large surge voltage appears and might destroy the IGBT 1. The surge voltage can be suppressed by lowering the turn-off speed. Incidentally, control means is configured of the control circuit 2, the buffer 3, the gate resistor 4 and the turn-off speed adjustment circuit 5.

A sampling circuit 6 detects a gate voltage Vg which is a controlled variable Qon exhibited immediately after the control circuit 2 has inputted the "ON" command from outside, and it permits a detection process for the gate voltage Vg, for a period corresponding to the gate voltage. A gate voltage detection type abnormality detection circuit 7 being a controlled-variable detection circuit detects the gate voltage Vg at the gate terminal of the IGBT 1, as the controlled variable of the buffer 3 for the IGBT 1, during the period for which the sampling circuit 6 permits the detection process for the gate voltage Vg (control voltage, or controlled variable), and it senses the occurrence of the abnormality in the IGBT 1 when the gate voltage Vg exceeds a gate voltage reference value Vgr being a controlled-variable comparison value. Besides, the gate voltage reference value Vgr changes in accordance with the gate voltage Vg being the controlled variable Qon exhibited immediately after the control circuit 2 has inputted the "ON" command from outside.

Figure 2:
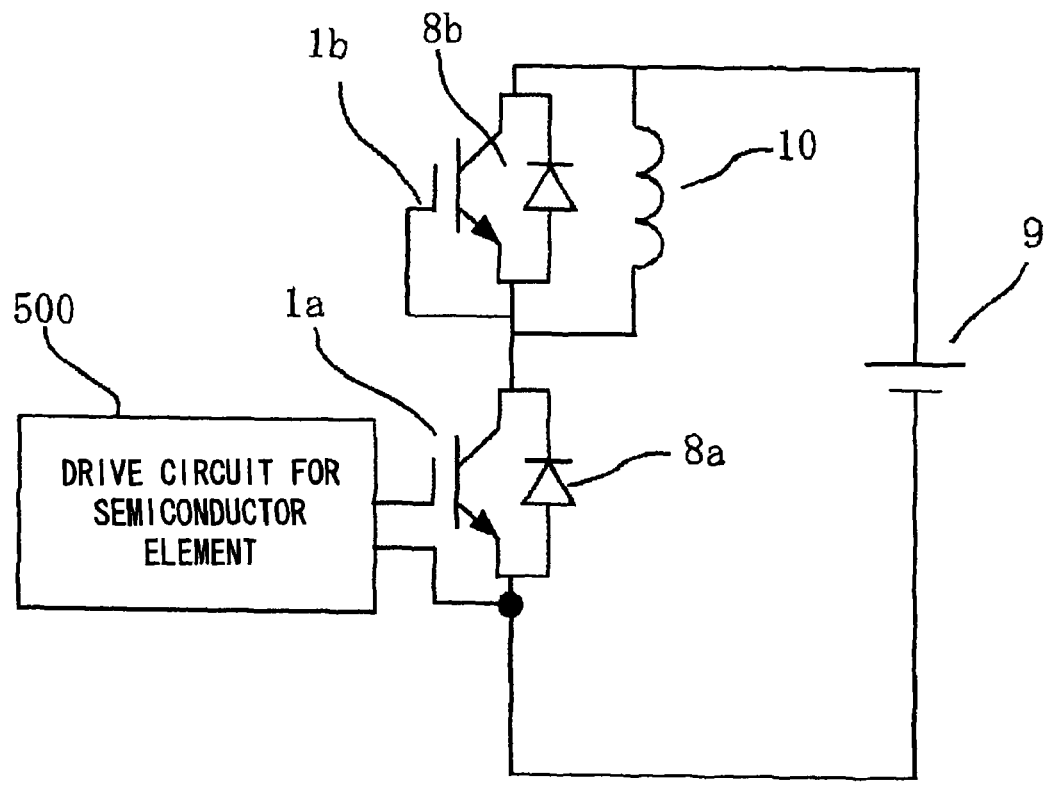
[FIG. 2] It is a circuit diagram showing a half-bridge circuit to which the drive circuit in Embodiment 1 of this invention is applied.

FIG. 2 is a circuit diagram showing a half-bridge circuit to which the drive circuit 500 for the power semiconductor element as shown in FIG. 1 is applied. Referring to FIG. 2, freewheeling diodes 8a and 8b are connected reversely in parallel with IGBTs 1a and 1b, and the drive circuit 500 for the semiconductor element is connected to the IGBT 1a. Besides, an inductive load 10 is connected to a DC power source 9.

Although the application of the drive circuit 500 for the power semiconductor element, to the half-bridge circuit is illustrated here, it is needless to say that the application is not restrictive, but that the drive circuit may be applied to another circuit.

Figure 3:
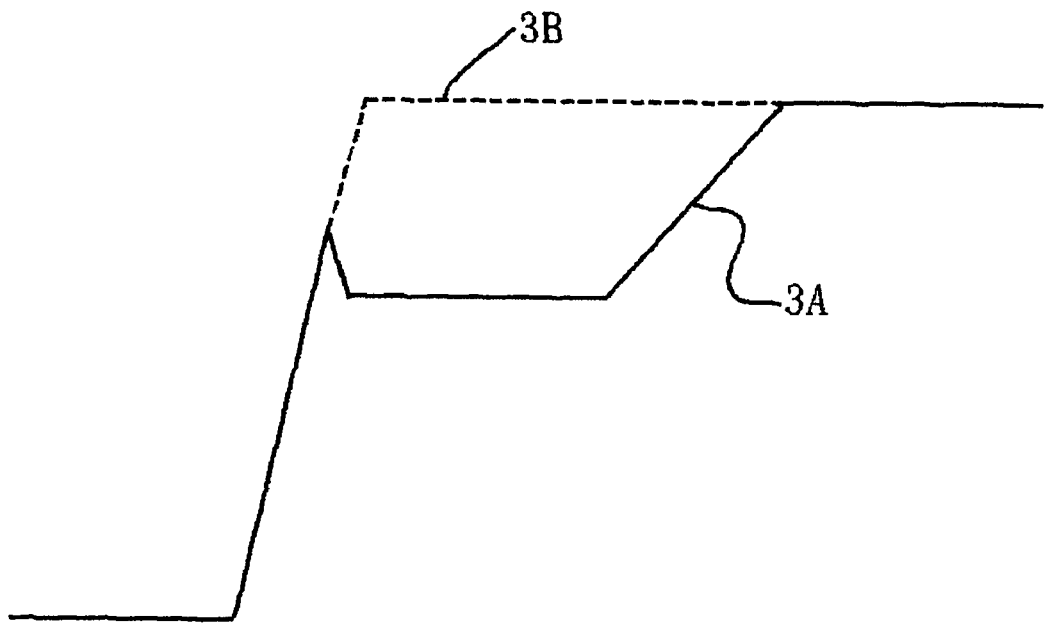
[FIG. 3] It is an explanatory diagram showing gate voltage waveforms in the normal mode and abnormal mode of an IGBT.

FIG. 3 is a diagram showing gate voltage waveforms in the cases where the switching of the IGBT is normal and abnormal. In general, the gate voltage becomes as indicated by a solid line 3A in FIG. 3, in the ordinary switching mode of the IGBT. When a large short-circuiting current flows through the IGBT, for example, due to the occurrence of arm short-circuiting in FIG. 2 for any cause, the gate voltage becomes as indicated by a broken line 3B. The drive circuit for the power semiconductor element senses the abnormality of the IGBT by detecting the difference of the voltages. Since the voltage difference appears only in the transient period of the switching, the function of defining the detection period as in the sampling circuit 6 in FIG. 1 as stated before is necessitated.

Figure 4:
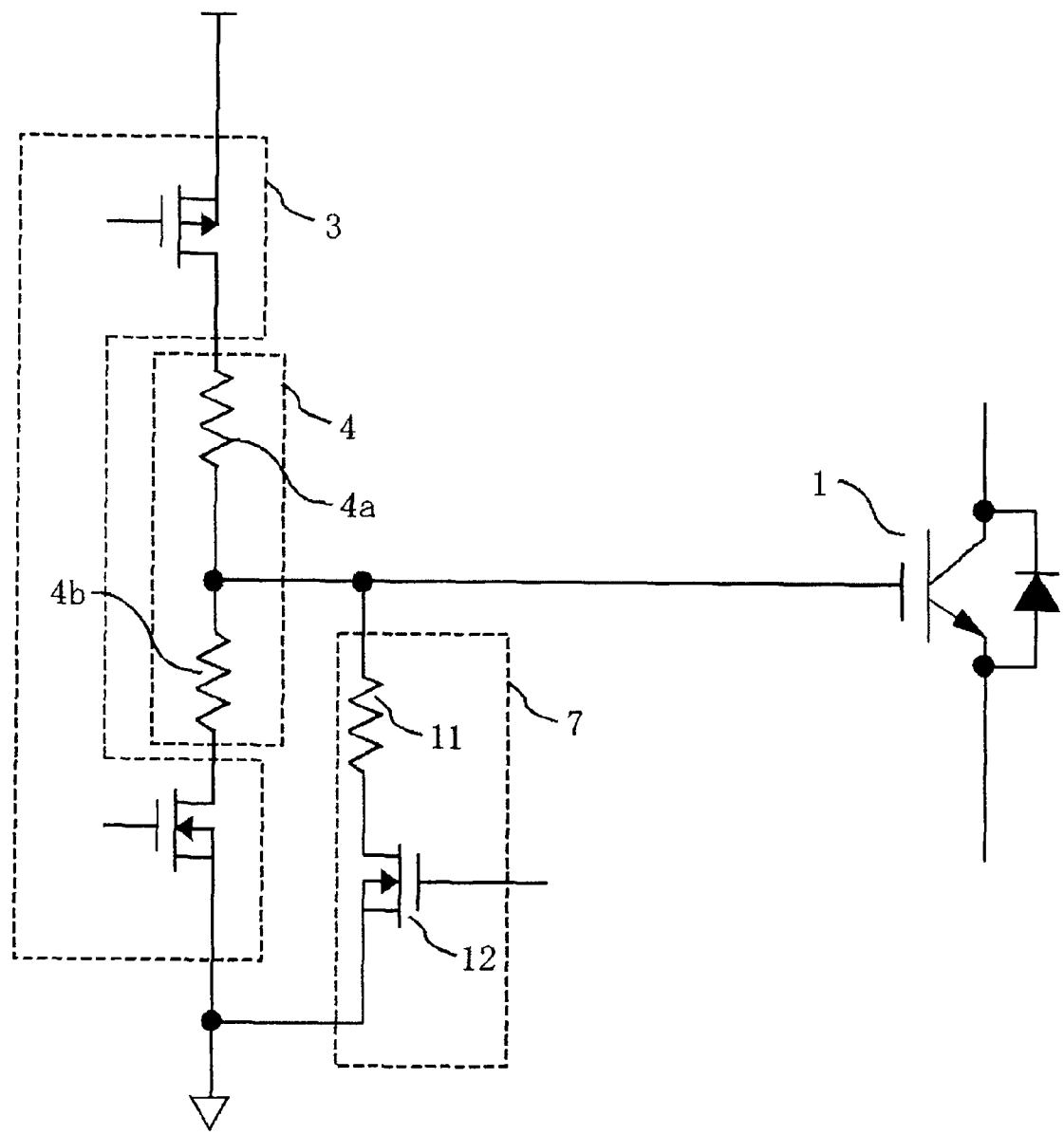
[FIG. 4] It is a configuration diagram showing an example of a turn-off speed adjustment circuit in Embodiment 1 of this invention.

FIG. 4 is a diagram showing an example of the turn-off speed adjustment circuit 5. Referring to FIG. 4, a turn-off speed adjustment gate resistor 11 is set larger in resistance value than an ordinary "OFF" gate resistor 4b. Therefore, a current value which is drawn from the gate terminal of the IGBT 1 becomes smaller than in an ordinary turn-OFF operation, so that turn-OFF becomes slower. By the way, in FIG. 4, sign 4a denotes an ON-gate resistor, sign 4b the ordinary "OFF" gate resistor, numeral 11 the turn-off speed adjustment gate resistor, and numeral 12 an N-channel MOSFET.

Figure 5:
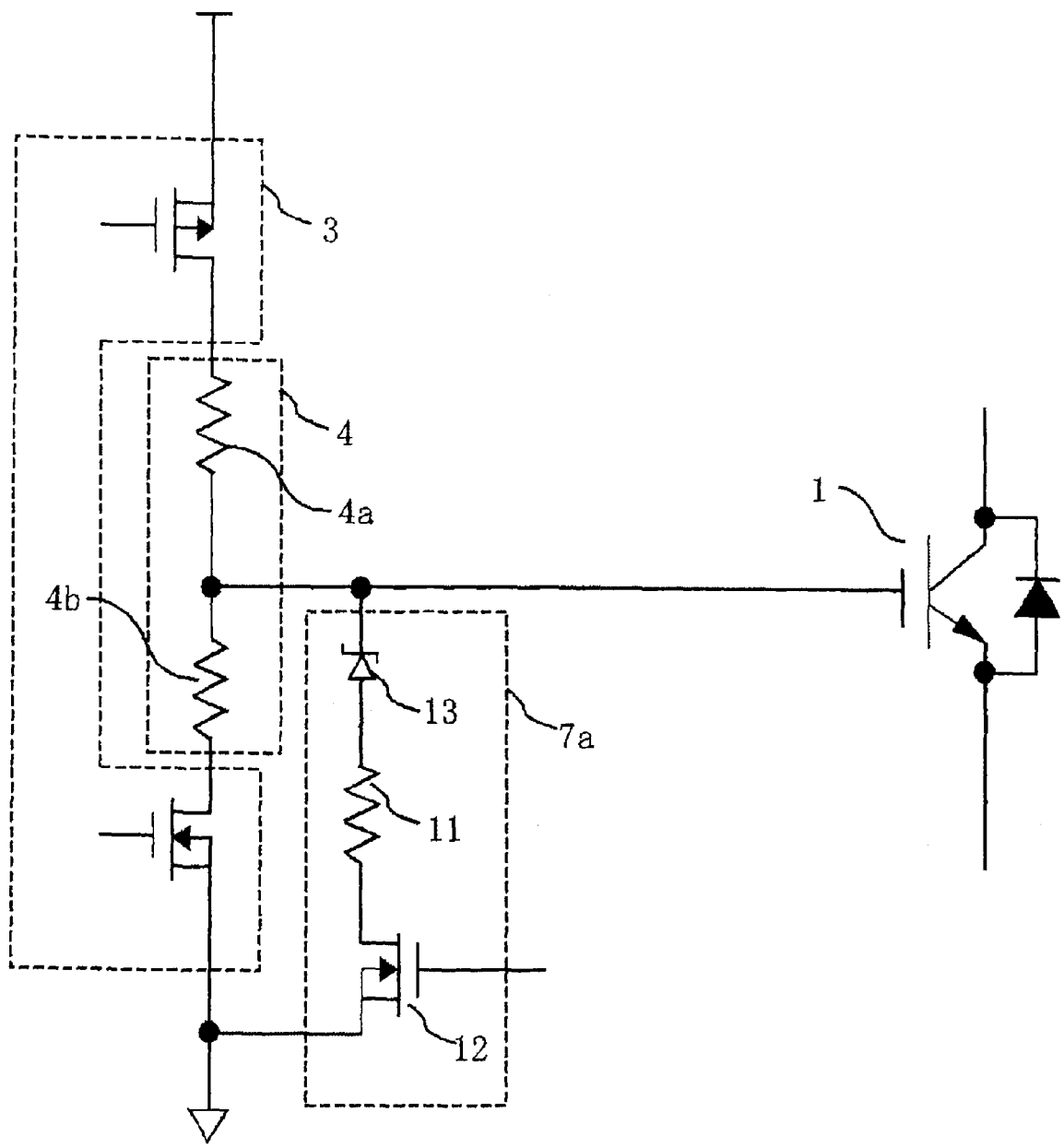
[FIG. 5] It is a configuration diagram showing an example of the turn-off speed adjustment circuit in Embodiment 1 of this invention.

Besides, FIG. 5 is a diagram showing another example of a turn-off speed adjustment circuit 5a. Referring to FIG. 5, the Zener voltage of a Zener diode 13 is set at a value which is smaller than that of the gate threshold voltage of the IGBT 1. Also in this case, a current value which is drawn from the gate of the IGBT 1 becomes smaller, so that turn-OFF becomes slower.

Figure 6:
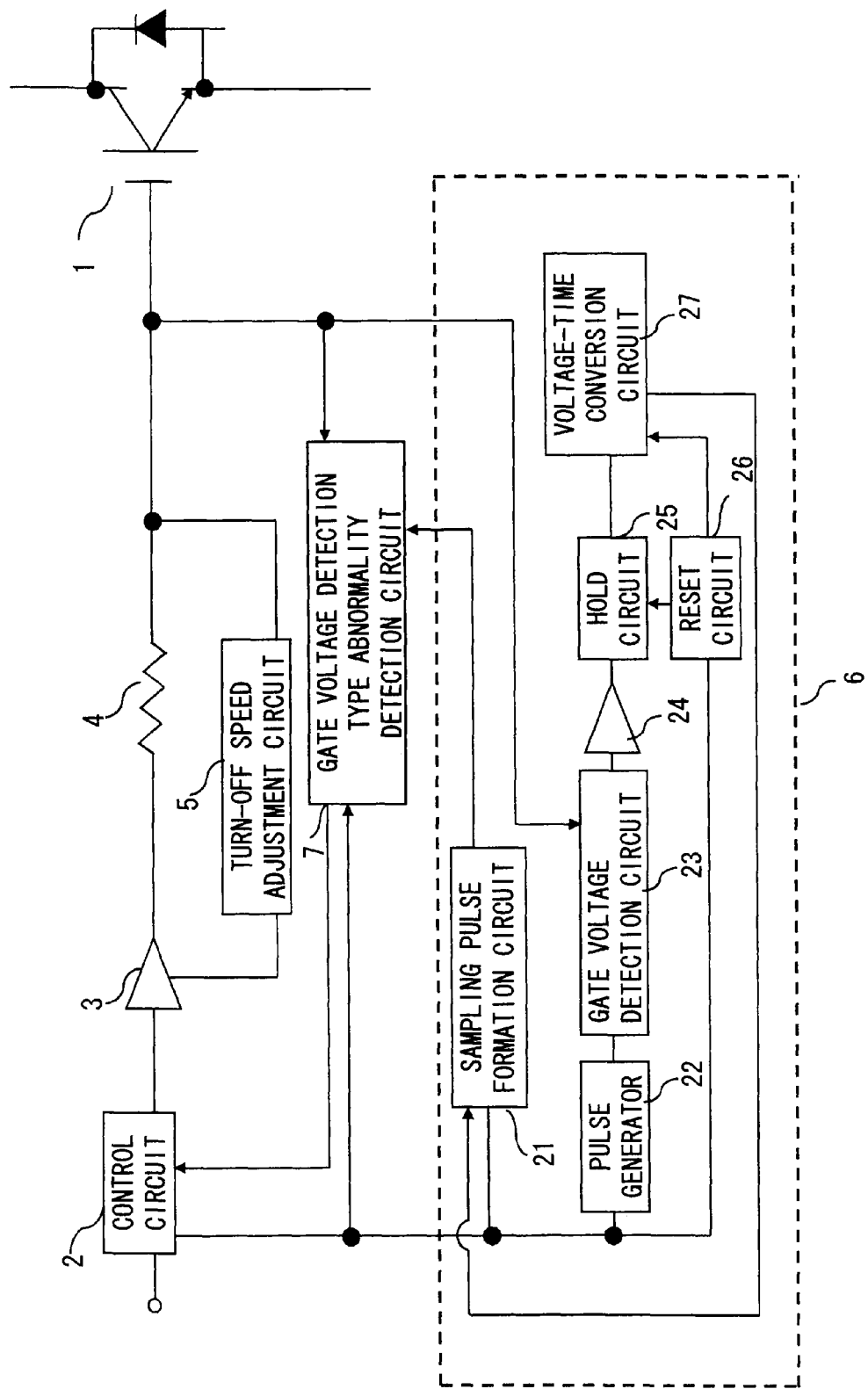
[FIG. 6] It is a configuration diagram showing an example of a sampling circuit in Embodiment 1 of this invention.

FIG. 6 is a block diagram showing an example of the configuration of the sampling circuit 6.

Referring to FIG. 6, a pulse generator 22 receives the "ON" signal of the control circuit 2 and outputs a certain fixed pulse. During the period of the pulse, a gate voltage detection circuit 23 acquires the gate voltage Vg being the controlled variable Qon. The gate voltage Vg is held in a hold circuit 25 through a buffer 24, and it is converted into a time period by a voltage-time conversion circuit 27. The time period obtained by the voltage-time conversion circuit 27 becomes a time period which corresponds to the voltage Vg detected by the gate voltage detection circuit 23. A sampling pulse formation circuit 21 arithmetically operates the pulse outputted by the voltage-time conversion circuit 27 and a pulse set in the sampling pulse formation circuit 21 beforehand, whereby the gate voltage detection type abnormality detection circuit 7 determines the period for which the gate voltage is detected.

Figure 7:
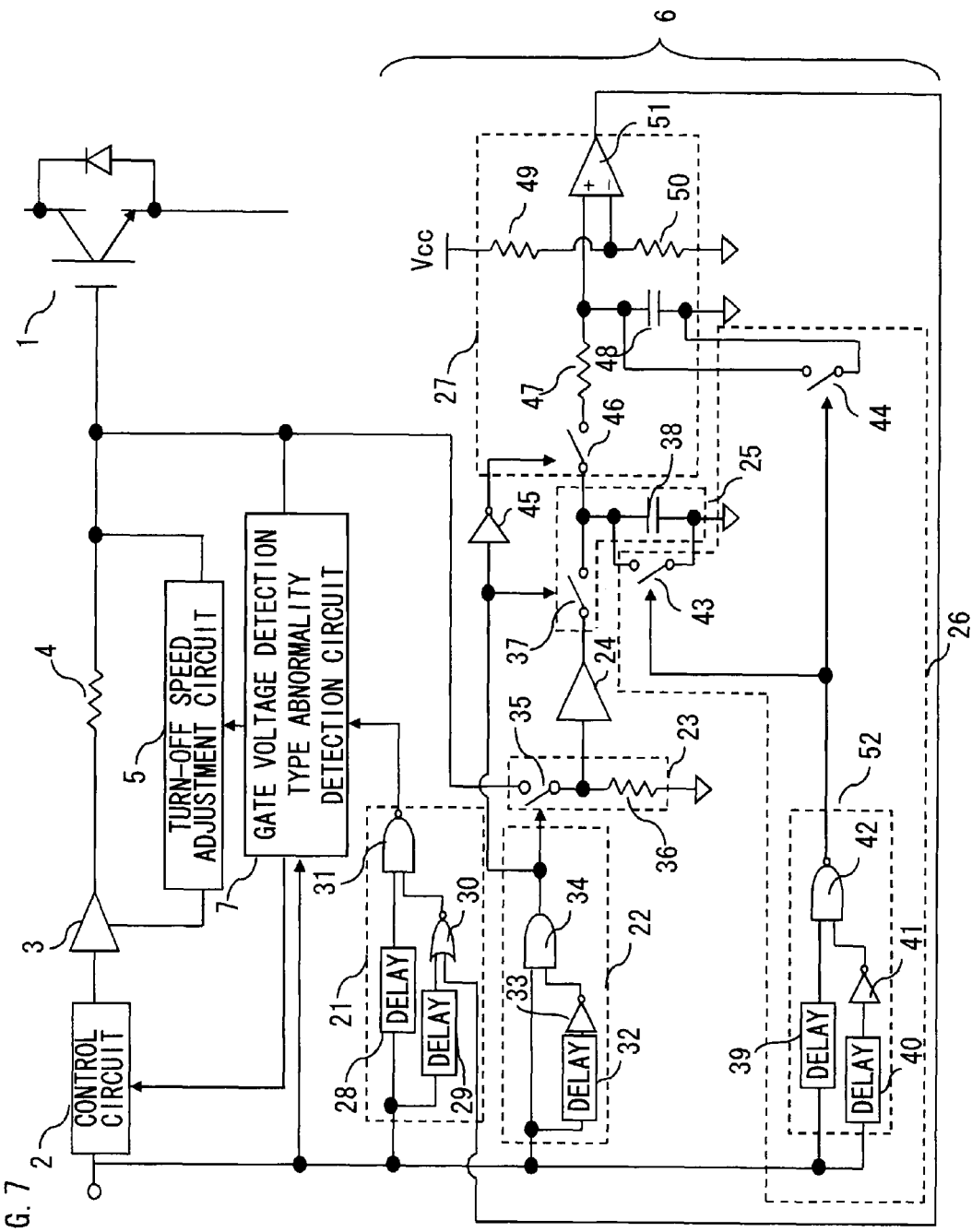
[FIG. 7] It is a configuration diagram showing an example of the sampling circuit in Embodiment 1 of this invention.

FIG. 7 is a circuit diagram showing a specific detailed example of the sampling circuit 6.

The pulse generator 22 is constituted by a delay circuit 32, a NOT circuit 33 and an AND circuit 34, and it generates the pulse for the period determined by the delay circuit 32, after the control circuit 2 has generated the "ON" pulse. A switch 35 and a switch 37 are turned "ON" for the period for which the pulse generator 22 generates the pulse, whereby the gate voltage Vg is acquired by a resistor 36. The gate voltage detection circuit 23 is constituted by the switch 35 and the resistor 36. Any of a MOSFET, a bipolar transistor, an analog switch and a mechanical switch may be employed as each of the switches. The signal detected by the gate voltage detection circuit 23 is charged into a capacitor 38 through a buffer 24 and the switch 37. The hold circuit 25 is constituted by the switch 37 and the capacitor 38. At the same time that the switch 35 is turned "OFF", the switch 37 is turned "OFF", thereby to prevent the voltage of the capacitor 38 from being discharged through the buffer 24. After the end of the period for detecting the gate voltage Vg as is outputted by the pulse generator 22, the switch 37 is turned "OFF", and a switch 46 is turned "ON" by a signal inverted by a NOT circuit 45. Charges stored in the capacitor 38 are stored in a capacitor 48 through a resistor 47. A DC voltage Vcc shown in the figure is divided by a resistor 49 and a resistor 50, and a reference voltage Vref is connected to one terminal of a comparator 51. The voltage of the capacitor 48 is inputted to the plus terminal of the comparator 51, and when this voltage becomes larger than the reference voltage Vref, the comparator 51 outputs a high-level signal to the NOR circuit 30 of the sampling pulse formation circuit 21. The sampling pulse formation circuit 21 is a circuit which determines the detection period of the gate voltage detection type abnormality detection circuit 7. The start time of the detection period is determined by a delay circuit 28, while the end time of the detection period is determined by a delay circuit 29 and the output signal of the voltage-time conversion circuit 27.

Figure 8:
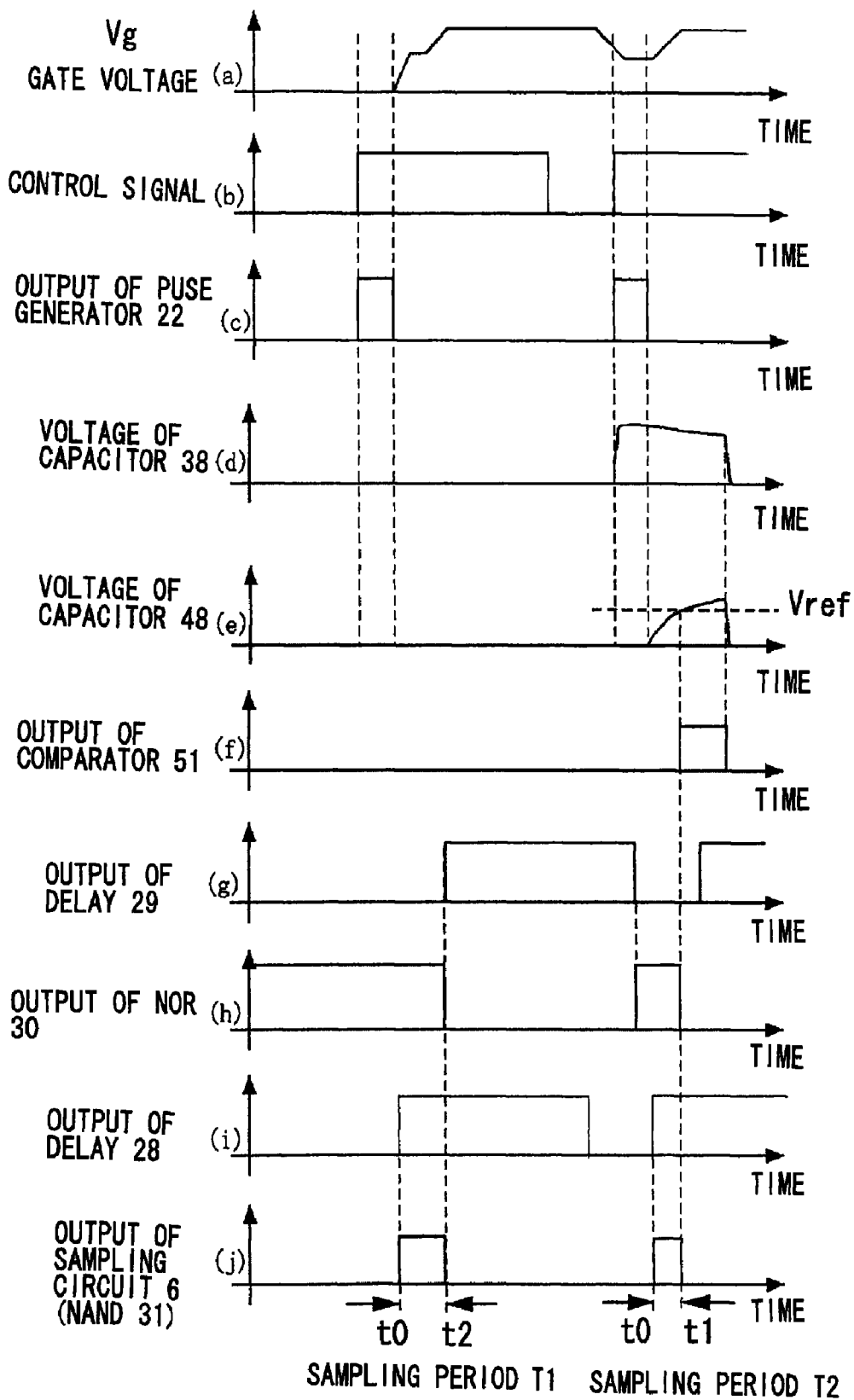
[FIG. 8] It is an explanatory diagram showing the operating sequence of the drive circuit in Embodiment 1 of this invention.

The operation of the sampling circuit 6 at the time when the "ON" command has been issued from the control circuit 2, will be described in conjunction with a time chart of FIG. 8. The operation in the case where pulses like a control signal (b) have been outputted from the control circuit 2, is illustrated. The two "ON" pulses have been issued in FIG. 8, and the first "ON" pulse on the left side of the figure corresponds to a case where the "ON" command has been issued in a state in which the gate voltage Vg has not risen, while the second "ON" pulse on the right side corresponds to a case where the "ON" command has been issued in a state in which the gate voltage Vg has not lowered fully. Here, the pulse generator 22 outputs a pulse (c) of a width determined by the delay circuit 32, from the time point of the ON-pulse rise of the control signal (b). The voltage of the capacitor 38 rises as shown at (d), in accordance with the gate voltage Vg of the period. After the output of the pulse generator 22 has become "OFF", the voltage of the capacitor 48 rises as shown at (e), and this voltage is compared with the reference voltage Vref. In a case where the voltage (e) of the capacitor 48 does not exceed the reference voltage Vref, that is, with the first "ON" command of the control signal (b), the output (f) of the comparator 51 remains at a low level, and hence, a sampling period T1 is determined by only the output of the control circuit 2. In a case where the voltage (e) of the capacitor 48 has exceeded the reference voltage Vref, that is, with the second "ON" command of the control signal (b), the output of the comparator 51 becomes a high level. A sampling period T2 is determined by this output of the comparator 51 and the output of the control circuit 2, and it is outputted to the gate voltage detection type abnormality detection circuit 7.

In the sampling formation circuit 21, the control signal (b) of the control circuit 2 is delayed by the delay circuit 29, thereby to obtain an output (g). In addition, the NOR between the output (g) of the delay circuit 29 and the output (f) of the comparator 51 is taken by the NOR circuit 30, thereby to obtain an output (h). On the other hand, the control signal (b) of the control circuit 2 is delayed by the delay circuit 28, thereby to obtain an output (i). In addition, a signal (j) in which the NAND between the output (i) of the delay circuit 28 and the output (h) of the NOR 30 is taken by a NAND circuit 31 is outputted to the gate voltage detection type abnormality detection circuit 7. A reset circuit 26 is a circuit for discharging the charges of the capacitor 38 and the capacitor 48, and it has such a configuration that a discharge signal is generated by a pulse generation circuit 52 which is constituted by delay circuits 39 and 40, a NOT circuit 41 and a NAND circuit 42, and that the charges are discharged by switches 43 and 44. The discharge is performed during the "ON" period and before arrival at turn-OFF, and the timings thereof are adjusted by the pulse generation circuit 52.

When, in the above operation, the "ON" signal enters in a state where the gate voltage Vg remains, the sampling period is shortened as from the sampling period T1 (t2−t0) to the sampling period T2 (t1−t0).

The relationship between the gate voltage Vg at the time point t0 at which the "ON" pulse has entered from the control circuit 2 and the sampling period as described above, becomes as illustrated in FIG. 9. When the input capacitance of the IGBT 1 and the value of the gate resistor 4 change, the characteristic shown in FIG. 9 must be changed accordingly. Also, as will be stated later, in case of a cooperative operation with a function in which the abnormality decision threshold value Vgr of the gate voltage as is the controlled-variable comparison value is changed depending upon the gate voltage Vg at the time point of the entry of the "ON" signal, the value Vgr must be adjusted to a certain value. The characteristic in FIG. 9 is adjusted by the capacitor 38, the resistor 47, the capacitor 48, and the resistors 49 and 50.

Figure 10:
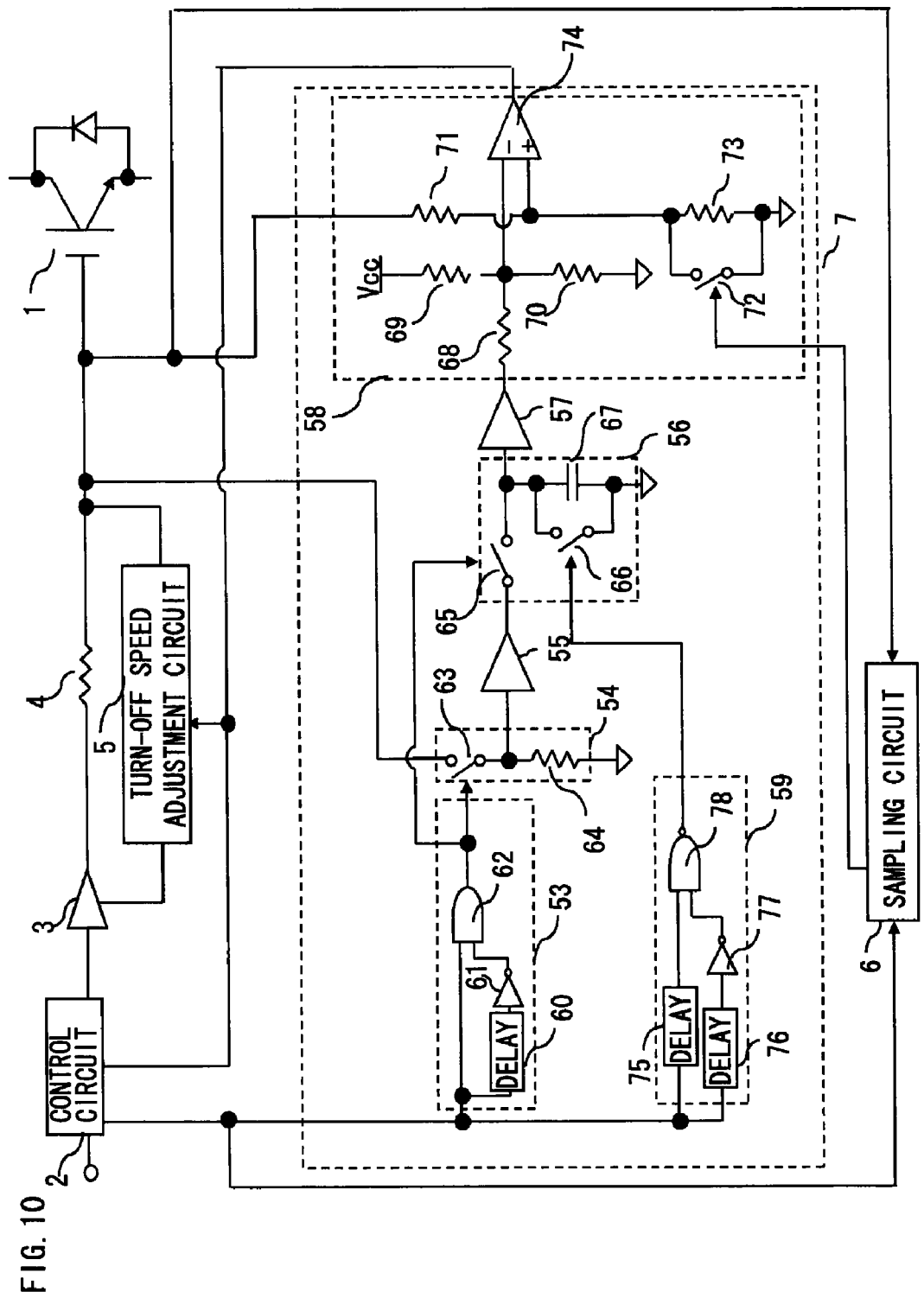
[FIG. 10] It is a configuration diagram showing an example of a gate voltage detection type abnormality detection circuit in Embodiment 1 of this invention.

Next, a specific example of the gate voltage detection type abnormality detection circuit 7 is shown in FIG. 10. A switch 72 is held "OFF" during the period for which the sampling circuit 6 permits the gate voltage detection. When a voltage obtained by dividing the gate voltage Vg by a resistor 71 and a resistor 73 becomes larger than the voltage of minus terminal of a comparator 74, a turn-off signal is sent to the turn-off speed adjustment circuit 5 and the control circuit 2. A pulse generation circuit 53, a gate voltage detection circuit 54, a hold circuit 56 and a reset circuit 59 are the same in configurations and in operations as in the sampling circuit 6 shown in FIG. 7, and shall therefore be omitted from description. A voltage which corresponds to the gate voltage Vg at the time point when the "ON" pulse has entered from the control circuit 2, is outputted from a buffer 57. Assuming "Vvar" denote the voltage which is outputted from the buffer 57, the voltage V_ of minus terminal of the comparator 74 becomes the linear function of the voltage Vvar. When, in this manner, the "ON" signal enters in a state where the gate voltage Vg remains, the voltage Vvar rises, and hence, a threshold value for deciding the abnormality of the IGBT 1, namely, the voltage V_ of minus terminal of the comparator 74 rises, so that the erroneous sensing of the abnormality is avoided.

The relationship between the gate voltage Vg at the time point at which the "ON" pulse has entered from the control circuit 2 and the abnormality decision threshold voltage Vgr as described above, becomes as illustrated in FIG. 11. When the input capacitance of the IGBT 1 and the value of the gate resistor 4 change, the characteristic shown in FIG. 11 must be changed accordingly. Also, as will be stated later, in case of the cooperative operation with the function in which the sampling period is changed depending upon the gate voltage Vg at the time point of the entry of the "ON" signal, the value Vgr must be adjusted to a certain value. The characteristic shown in FIG. 11 is adjusted by resistors 68, 69 and 70.

Figure 9:
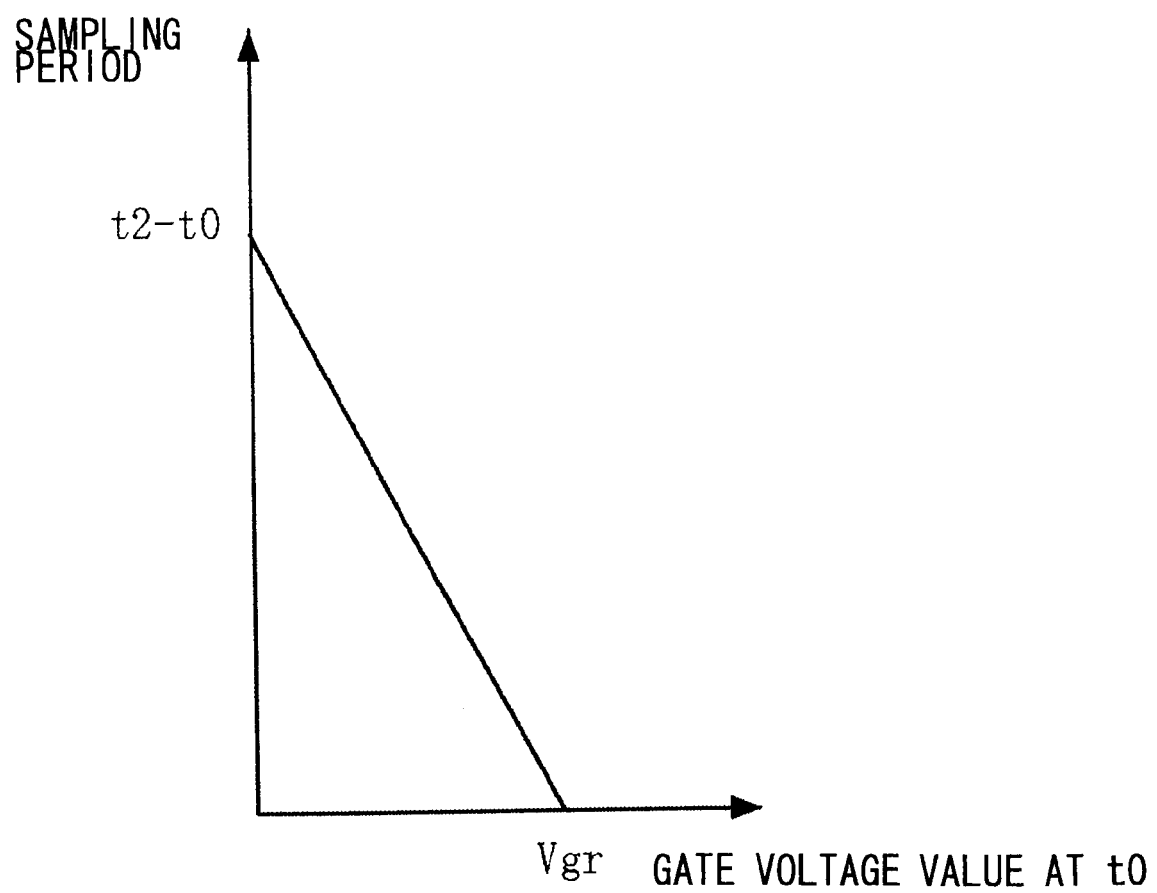
[FIG. 9] It is an explanatory diagram showing the detection period of the sampling circuit in Embodiment 1 of this invention.
Figure 11:
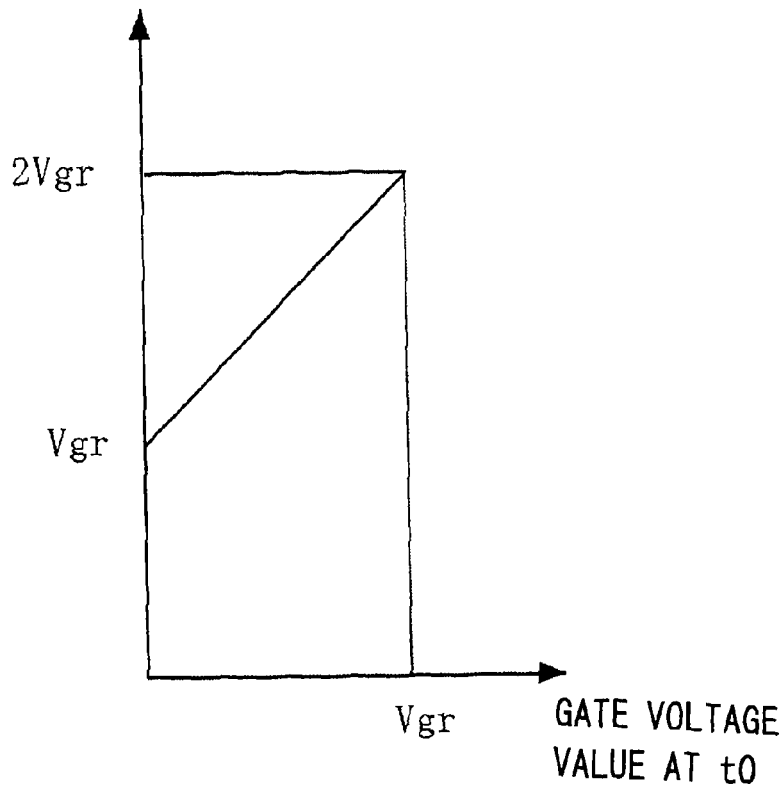
[FIG. 11] It is an explanatory diagram showing the reference voltage of the gate voltage detection type abnormality detection circuit in Embodiment 1 of this invention.
Figure 12:
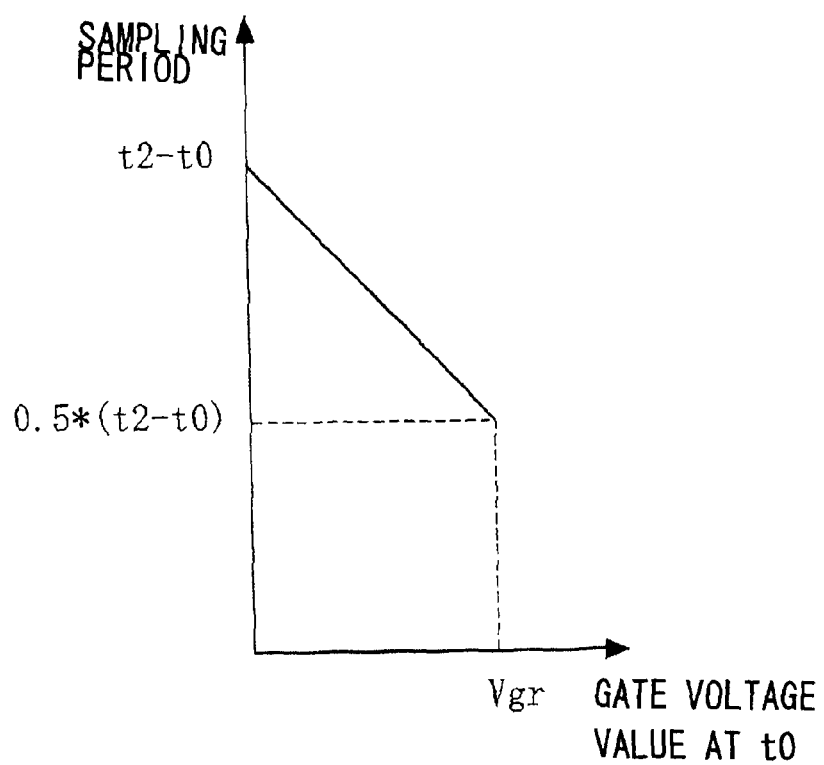
[FIG. 12] It is an explanatory diagram showing the detection period of the sampling circuit in Embodiment 1 of this invention.
Figure 13:
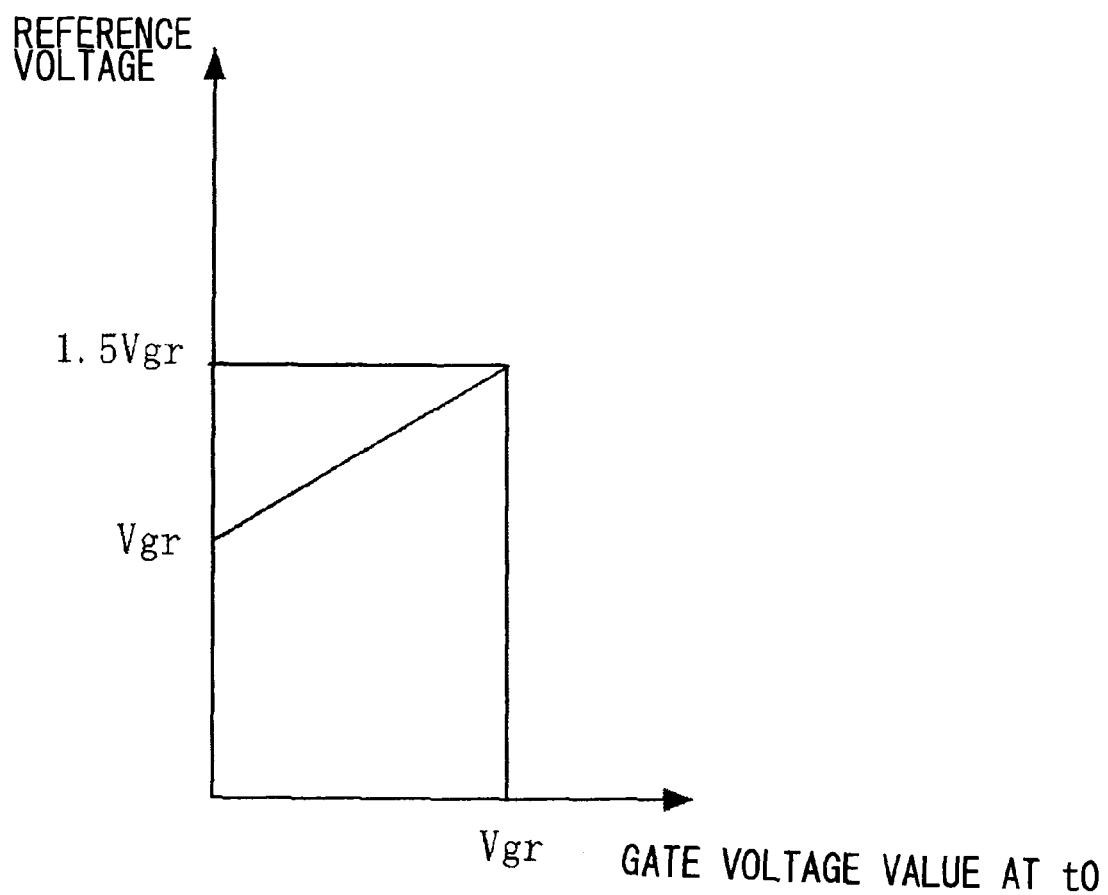
[FIG. 13] It is an explanatory diagram showing the reference voltage of the gate voltage detection type abnormality detection circuit in Embodiment 1 of this invention.

Regarding the above changes of the sampling period for the gate voltage Vg as shown in FIG. 9 and the reference voltage Vgr for the gate voltage Vg as shown in FIG. 11, at least either may be applied. Besides, in case of applying both, the constants are adjusted so that the changes may operate cooperatively and that they may not be excessively corrected. Assuming that the correction proportions of the respective circuits are equal, multipliers may be concretely adjusted as shown in FIGS. 12 and 13.

Figure 14:
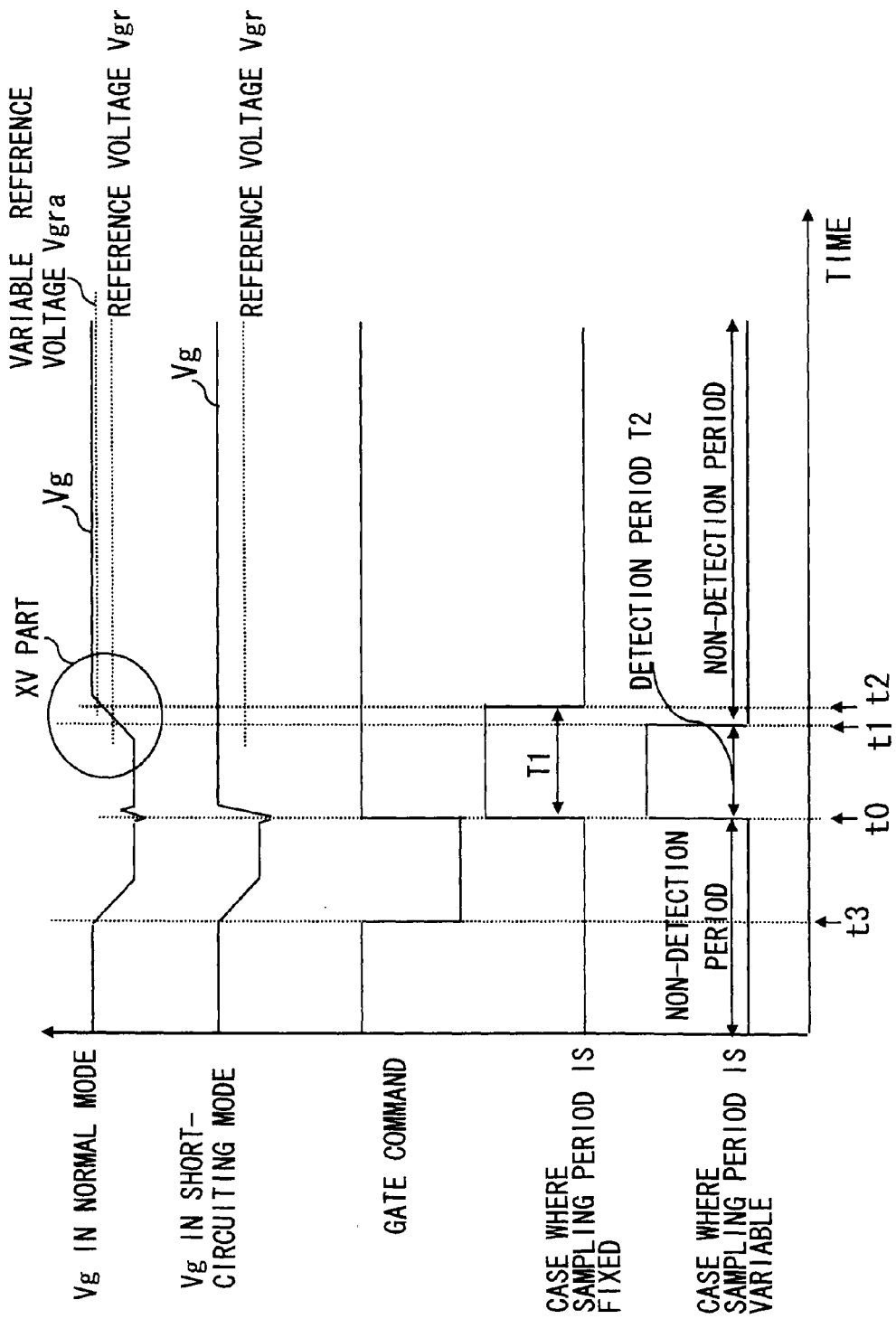
[FIG. 14] It is an explanatory diagram showing the operating sequence of the drive circuit for the semiconductor element in Embodiment 1 of this invention at the time when the next "ON" has entered in a state where a gate voltage has not lowered fully.
Figure 15:
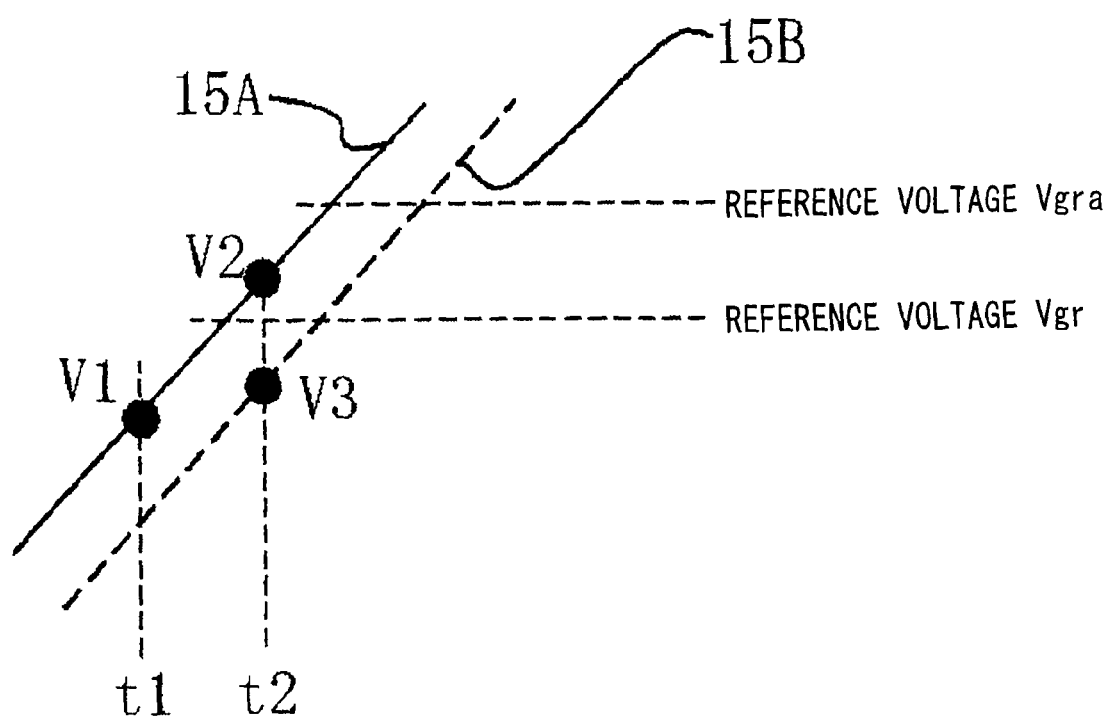
[FIG. 15] It is an explanatory diagram showing the operating sequence of the drive circuit for the semiconductor element in Embodiment 1 of this invention.

FIG. 14 is a diagram showing the operating sequence of the drive circuit for the semiconductor element in the case where the next "ON" command has entered in a state in which the gate voltage Vg has not fallen fully to a predetermined voltage, while FIG. 15 is a diagram in which an XV part in FIG. 14 is enlarged. By the way, in FIG. 15, a solid line 15A indicates a gate voltage waveform in the case where the "ON" command has been given in the state in which the gate voltage remains, and a dotted line 15B indicates an ordinary gate voltage waveform (in the case where "ON" command has been given in the state in which the gate voltage has lowered fully).

The operation in the case where the next "ON" command being the second control signal in FIG. 8 has entered in the state in which the gate voltage Vg has not fully fallen to the predetermined voltage, will be described with reference to FIGS. 14 and 15. An "OFF" command enters at a time t3, and the gate voltage Vg of the IGBT begins to lower. When the "ON" command (control signal) enters at a time t0 midway of the lowering of the gate voltage Vg, this gate voltage Vg rises. On this occasion, assuming that a gate voltage detection period (sampling period) T1 (initial end time t0–terminal end time t2) is fixed, the gate voltage Vg rises to a voltage V2 at a time t2 as shown in FIG. 15. In this case, V2>Vgr (reference voltage) holds, so that the gate voltage detection type abnormality detection circuit 7 judges the IGBT 1 to be abnormal and issues a gate turn-off signal, in spite of the absence of arm short-circuiting or the like abnormality in the IGBT 1.

On the other hand, in a case where the gate voltage detection period is T2, that is, where the terminal end time of the detection period becomes t1 from t2 in accordance with the gate voltage at the time t0, the gate voltage becomes a voltage V1 at the terminal end time t1. Since V1<Vgr (reference voltage) holds, the gate voltage detection type abnormality detection circuit 7 judges the IGBT not to be abnormal, and it does not issue the gate turn-off signal.

Besides, when the reference voltage Vgr is changed to "Vgra" in accordance with the gate voltage at the time t0, without changing the gate voltage detection period T2, V2<Vgra holds at the time within the ordinary detection period T1, and hence, the gate voltage detection type abnormality detection circuit 7 does not issue the gate turn-off signal. By the way, in a case where the gate voltage Vg has turned "ON" from 0, the reference voltage becomes Vgr till the terminal end time t2 of the sampling detection period T1, and at the time t2, it is a voltage V3, and V3<Vgr holds, so that the fault of the IGBT 1 is not sensed.

Figure 16:
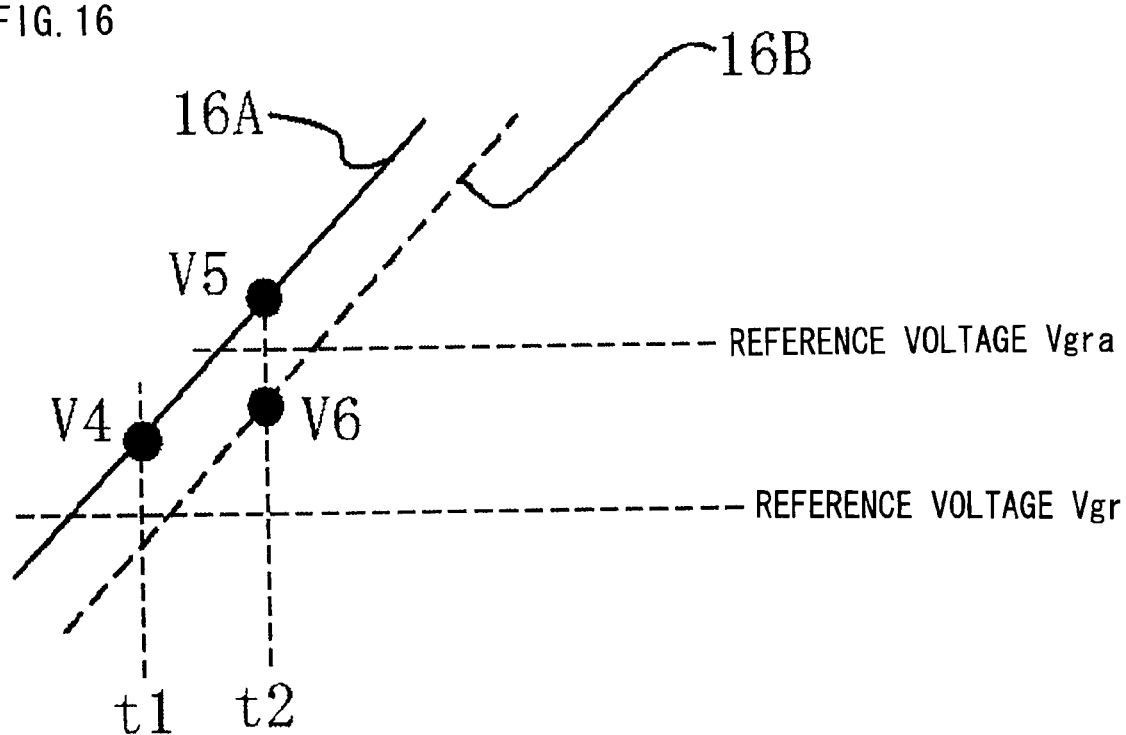
[FIG. 16] It is a diagram for explaining a gate voltage waveform at the occurrence of arm short-circuiting in Embodiment 1 of this invention.

Besides, FIG. 16 is an enlarged diagram showing a gate voltage waveform in the case where the arm short-circuiting has occurred. By the way, in FIG. 16, a solid line 16A indicates a gate voltage waveform in the case where the IGBT has short-circuited in the state in which the gate voltage remains, and a dotted line 16B indicates a gate voltage waveform in the case where the gate voltage has short-circuited from 0.

In the case where the gate voltage Vg has short-circuited from 0, the gate voltage Vg at the terminal end time t2 of the detection period T1 is "V6", and this voltage V6 is compared with the ordinary reference voltage Vgr. Since V6>Vgr holds here, the short-circuiting is decided. Next, there will be explained a short-circuiting decision in the case where short-circuiting has occurred in the state in which the gate voltage Vg remains. In the case where the detection period is set at "T2" (initial end time t0–terminal end time t1), the gate voltage Vg becomes "V4" at the terminal end time t1 of the detection period T2, and the voltage V4 is compared with the reference voltage Vgr. In the case where the detection period is set at "T1" (initial end time t0–terminal end time t2), the gate voltage Vg is "V5" at the terminal end time t2 of the detection period T1, and the voltage V5 is compared with the reference voltage Vgra. The gate voltage becomes larger than the reference voltage as V4>Vgr or V5>Vgra, so that the short-circuiting is decided.

As stated above, in the case where the gate voltage has not fallen to the predetermined voltage at the turn-ON of the IGBT, at least one of the gate voltage detection period and the reference voltage is endowed with a gate-voltage dependency, whereby any erroneous sensing is avoided, and the abnormality of the IGBT can be correctly sensed.

Embodiment 2

Figure 17:
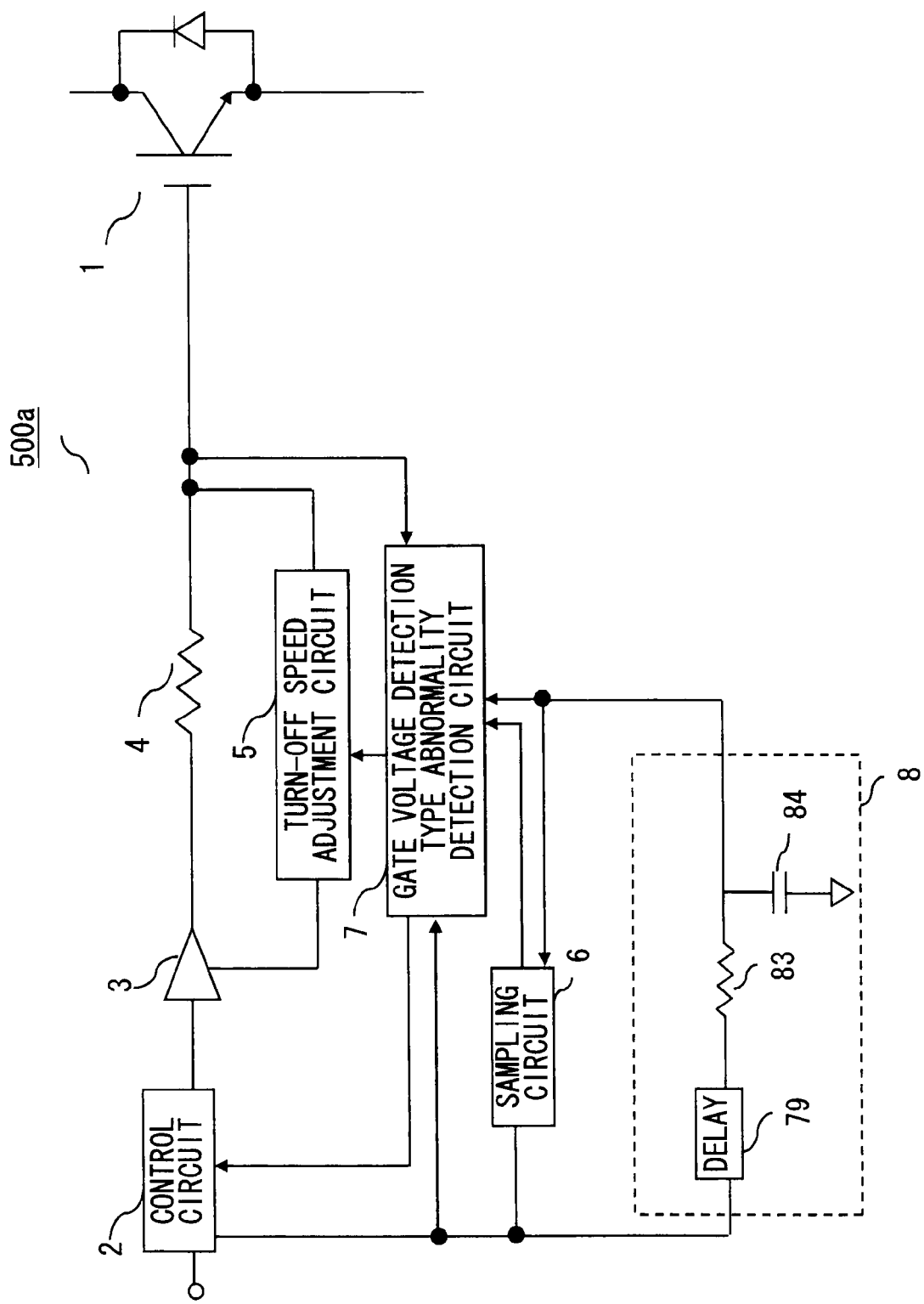
[FIG. 17] It is a configuration diagram showing a drive circuit for a power semiconductor element according to Embodiment 2 of this invention.

Next, Embodiment 2 of this invention will be described in connection with a drive circuit 500a shown in FIG. 17.

In Embodiment 1, the gate voltage detection period T2 and the reference voltage Vgr have been changed by directly detecting the gate voltage Vg of the IGBT 1. In Embodiment 2, a gate voltage estimation circuit 8 is disposed in addition to the configuration of the drive circuit 500 shown in FIG. 1 in Embodiment 1, as shown in FIG. 17. The gate voltage estimation circuit 8 estimates a gate voltage by using a control signal from the control circuit 2, and it outputs the estimated gate voltage to the sampling circuit 6 and the gate voltage detection type abnormality detection circuit 7, so as to perform an operation similar to that of Embodiment 1.

Figure 18:
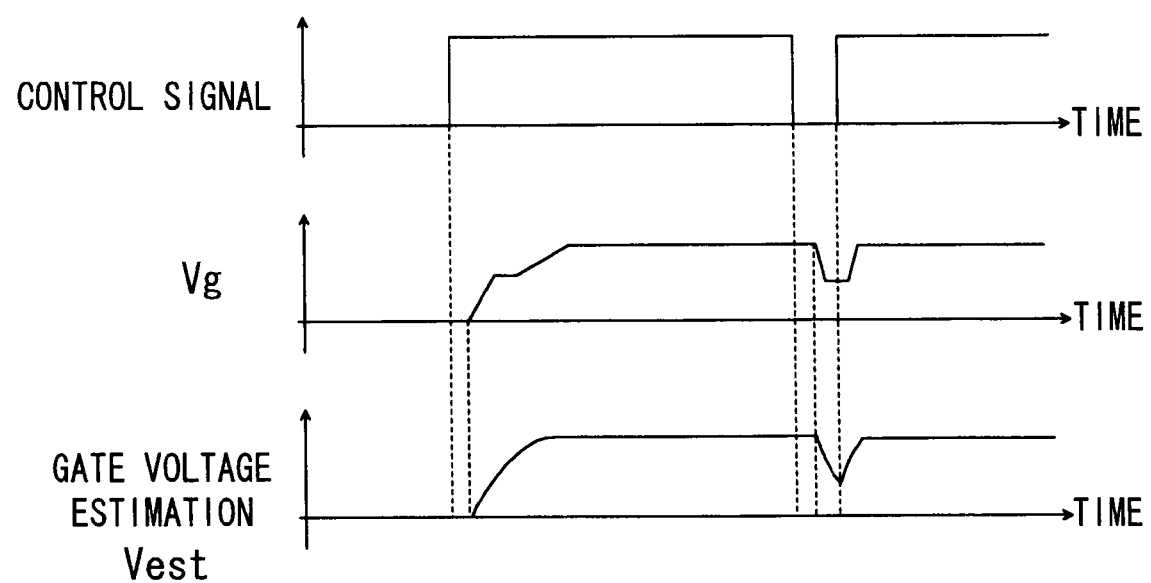
[FIG. 18] It is an explanatory diagram showing the estimated voltage waveform of a gate voltage estimation circuit in Embodiment 2 of this invention.

The control signal, the gate voltage and a gate-voltage estimation value are shown in FIG. 18. A time period from the issue of an "ON" pulse by the control signal, till the rise of the gate voltage Vg is delayed by a delay circuit 79 shown in FIG. 17. A capacitor whose capacitance is the same as the gate input capacitance of the IGBT 1 is employed as a capacitor 84, and a resistor 83 is set at the same value as that of the ON-gate resistor 4. When the constants of the resistor 83 and the capacitor 84 are brought into agreement with the input capacitance and gate resistance of the IGBT 1 in this manner, the gate voltage Vg and the gate-voltage estimation value Vest become substantially the same charging curves, and the gate-voltage estimation value Vest can be used instead of the gate voltage Vg.

Incidentally, although the gate voltage has been estimated by the gate-voltage estimation value circuit 8, an estimated current value may be outputted on the basis of the estimated gate voltage by disposing a gate-current estimation circuit in addition to the gate-voltage estimation circuit 8, or an estimated current value may be outputted merely by disposing a gate-current estimation circuit.

In this way, a wiring line 6a from the gate terminal G to the sampling circuit 6 in FIG. 1 in Embodiment 1 stated before is disposed with, and the drive circuit becomes more immune against noise.

Embodiment 3

Next, Embodiment 3 of this invention will be described.

Figure 19:
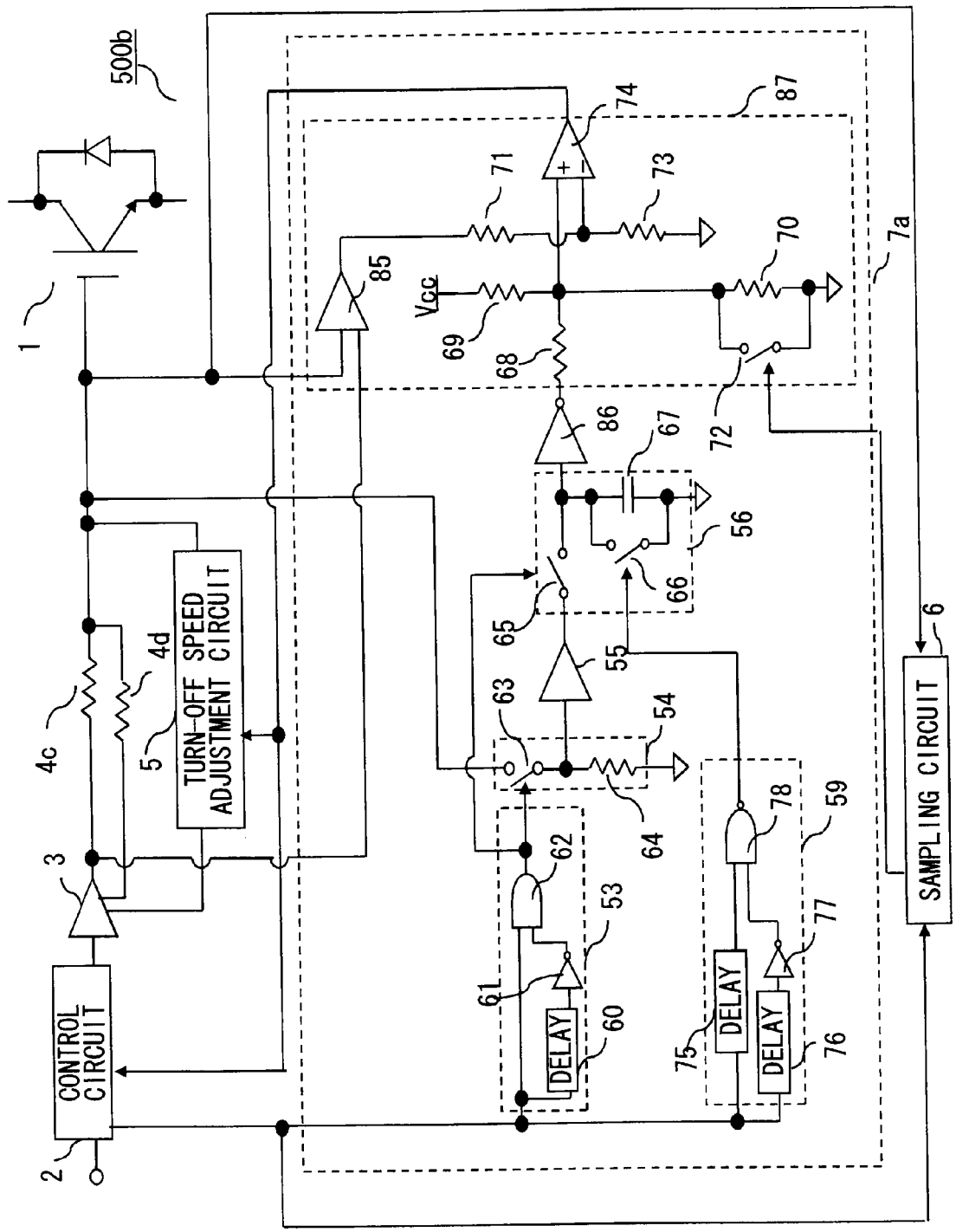
[FIG. 19] It is a configuration diagram showing a drive circuit for a power semiconductor element according to Embodiment 3 of this invention.
Figure 20:
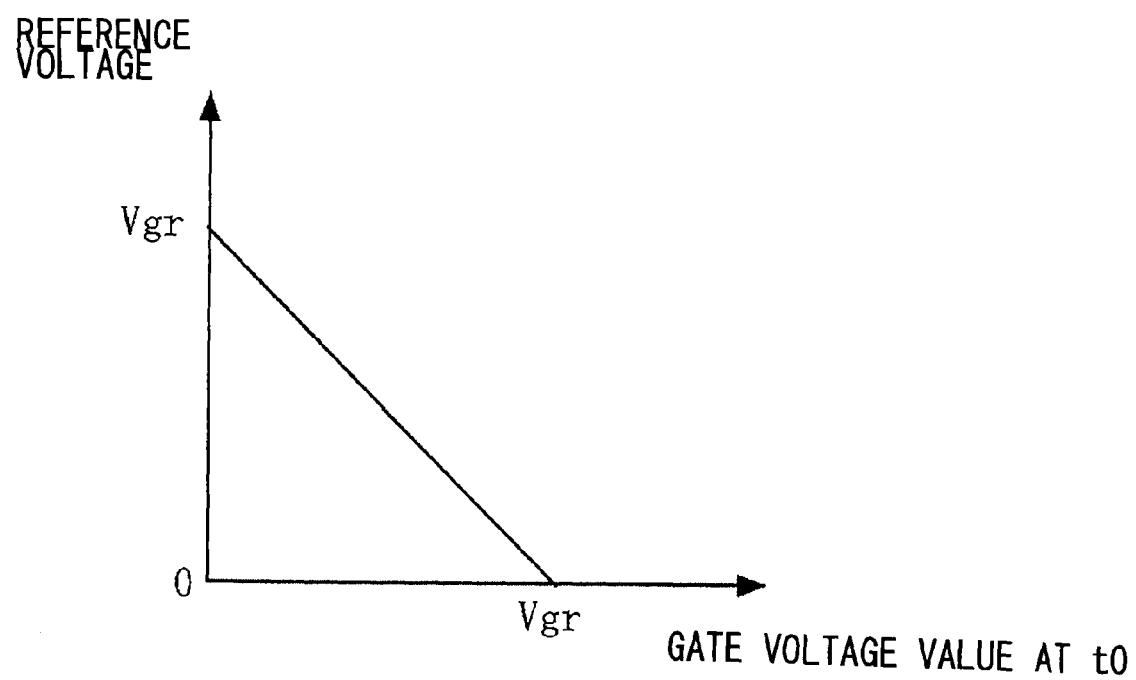
[FIG. 20] It is an explanatory diagram showing the detection period of a sampling circuit in Embodiment 3 of this invention.

FIG. 19 is a configuration diagram showing a drive circuit 500b for a power semiconductor element according to Embodiment 3. In FIG. 19, the same numerals and signs as in FIG. 10 in Embodiment 1 stated before designate identical or equivalent portions, and they shall therefore be omitted from description. Incidentally, sign 4c designates an ON-gate resistor, sign 4d an OFF-gate resistor, sign 7a a gate current detection type abnormality detection circuit, and numeral 87 a gate-current comparator circuit. The gate current detection type abnormality detection circuit 7a detects any abnormality of the IGBT 1 by detecting the terminal voltage of the ON-gate resistor 4c by a differential amplifier 85, and by detecting that a gate current Ig in a detection period set by a sampling circuit 6 is smaller than a threshold value. The gate-current threshold value Igr of the gate current detection type abnormality detection circuit 7a depends upon a gate voltage exhibited immediately after an "ON" command has been issued from a control circuit 2. The gate current detection type abnormality detection circuit 7a differs from the gate voltage detection type abnormality detection circuit 7 in FIG. 10 as stated before, in the point that the buffer 57 in FIG. 10 is replaced with an inverting buffer 86 in FIG. 19, and the threshold value Vgr becomes smaller as the gate voltage Vg exhibited immediately after the "ON" command has been issued from the control circuit 2 is higher. That is, the relationship between the gate voltage Vg exhibited immediately after the issue of the "ON" command and the threshold value Vgr is as shown in FIG. 20. The correction operation of the gate current detection period which is set by the sampling circuit 6 is similar to that of the detection period in Embodiment 1.

Figure 21:
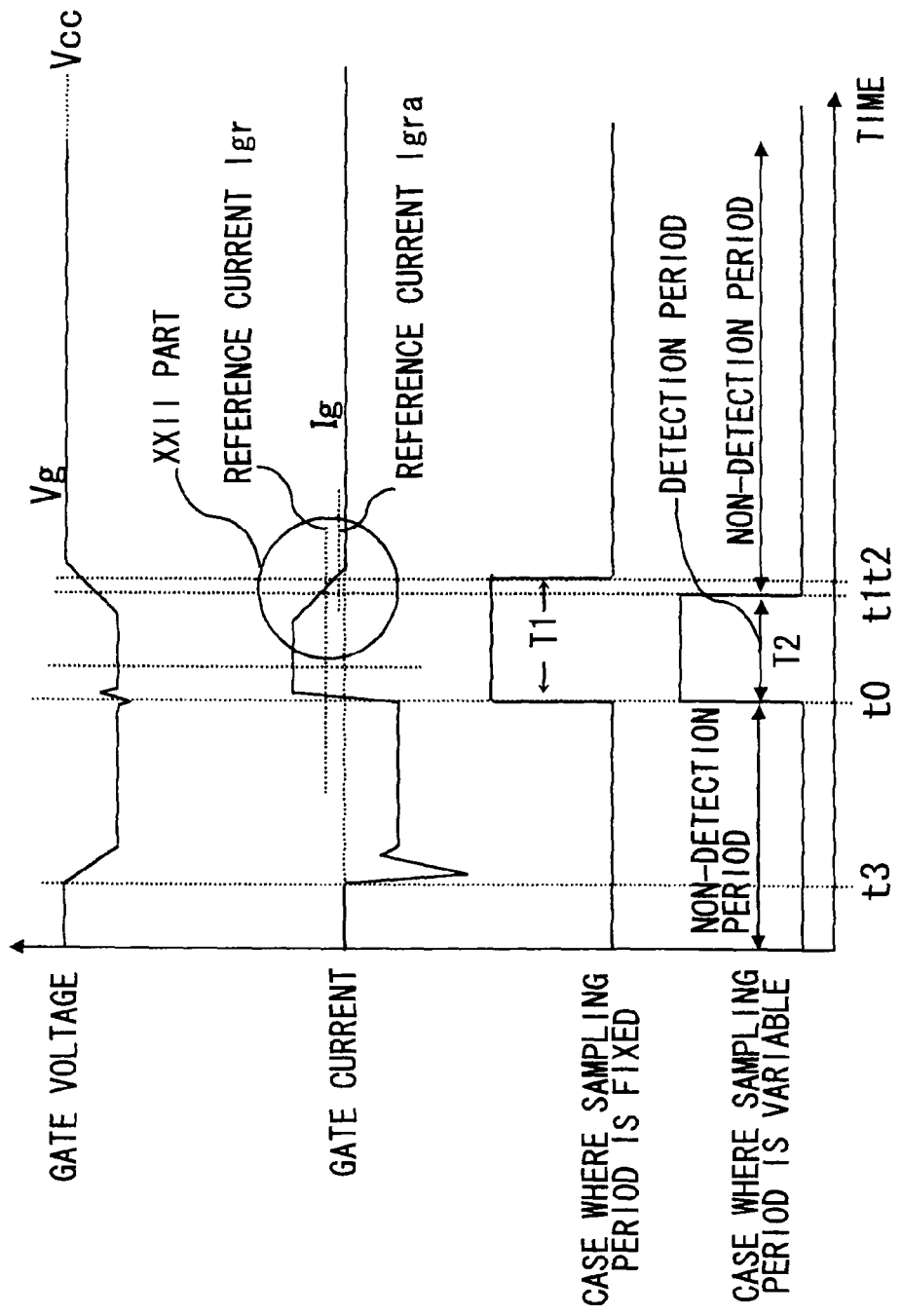
[FIG. 21] It is an explanatory diagram showing the operating sequence of the drive circuit for the power semiconductor element in Embodiment 3 of this invention, at the time when the next "ON" has entered in a state where the gate voltage of the IGBT has not lowered fully.
Figure 22:
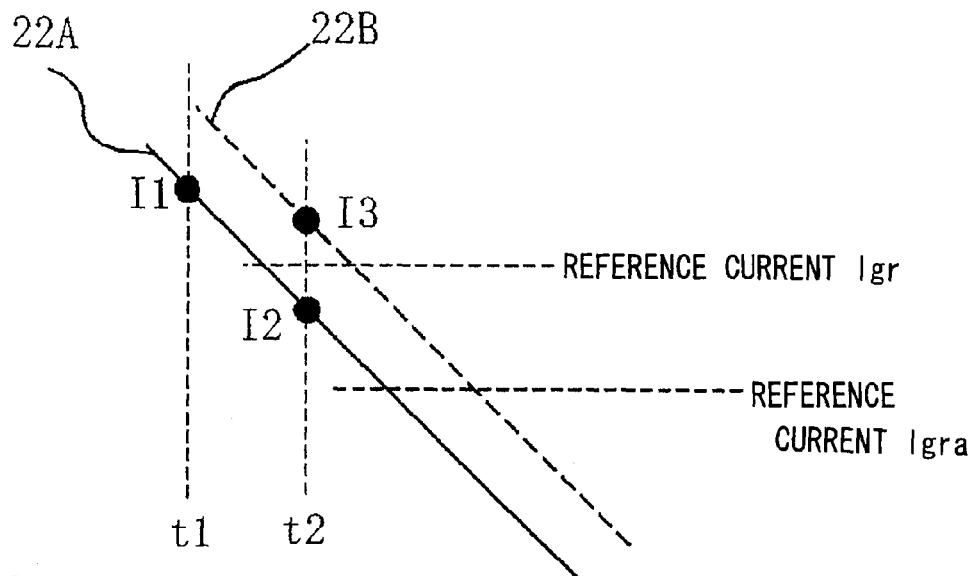
[FIG. 22] It is an explanatory diagram showing the reference currents of a gate current detection circuit in Embodiment 3 of this invention.

FIG. 21 is a diagram showing a time chart in the case where the next turn-ON begins in a state in which the gate current of the IGBT 1 does not return fully to zero, while FIG. 22 is an enlarged diagram of an XXII part in FIG. 21. By the way, in FIG. 22, a solid line 22A indicates a gate current waveform in the case of the turn-ON in a state where the gate current is flowing negatively, and a dotted line 22B indicates an ordinary gate current waveform.

The operation of the drive circuit will be described with reference to FIGS. 21 and 22. An "OFF" command enters at a time t3, and the gate current demonstrates a negative value. When an "ON" command enters at a time t0 midway of the negative gate current, the gate current demonstrates a positive value. On this occasion, assuming that the gate current detection period (sampling period) T1 is fixed, the gate current lowers from I3 to I2 at a time t2 as shown in FIG. 22. In spite of the absence of any abnormality in the IGBT 1, I2<Igr (reference current) holds, so that the gate current detection type abnormality detection circuit 7a judges the IGBT 1 to be abnormal and issues a gate turn-off signal.

On the other hand, in a case where the gate current detection period is T2, that is, where the terminal end time of the detection period becomes t1 from t2 in accordance with the gate voltage of the time t0, the gate current becomes I1 at the time t1, I1>Igr (reference current) holds, so that the abnormality signal is not issued.

Besides, when the reference current Igr is changed to "Igra" in accordance with the gate voltage at the time t0, likewise to changing the reference voltage Vg to "Vgr" in accordance with the gate voltage at the time t0 as indicated in Embodiment 1, without changing the gate current detection period T2, I2<Igra holds, and hence, the abnormality signal is not issued. By the way, in an ordinary case, I3>Igr holds, and it is not judged that the IGBT is abnormal.

Figure 23:
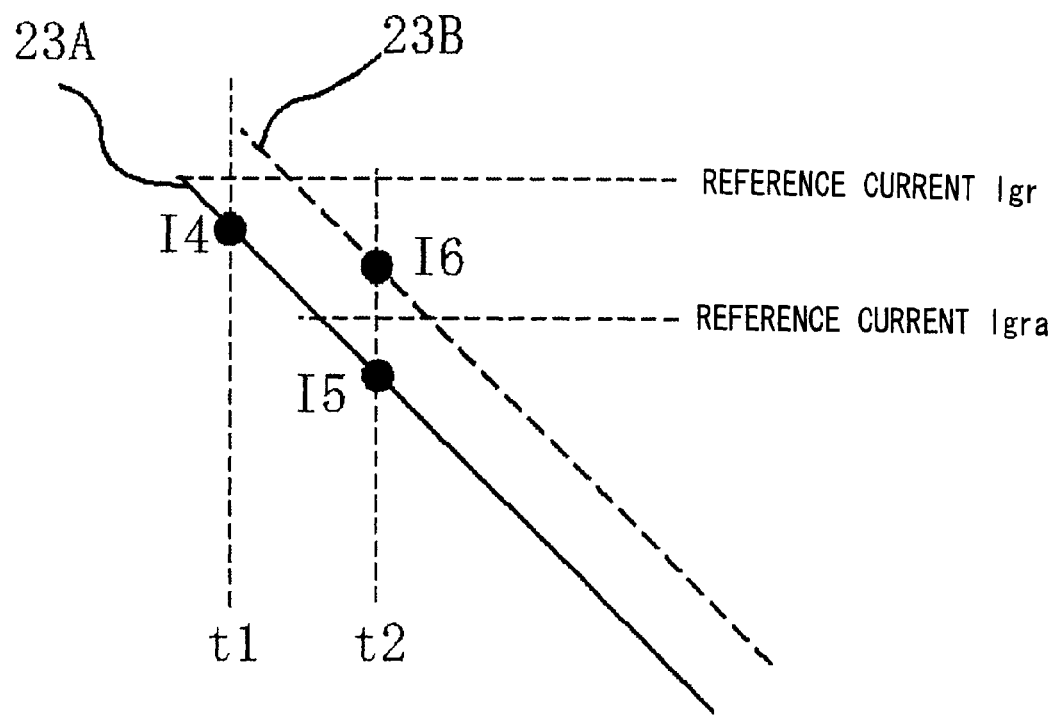
[FIG. 23] It is a diagram for explaining a gate current waveform at the occurrence of arm short-circuiting in Embodiment 3 of this invention.

Besides, FIG. 23 is an enlarged diagram showing a gate current waveform in the case where arm short-circuiting has occurred. By the way, in FIG. 23, a solid line 23A indicates a gate current waveform in the case of the short-circuiting in a state where the gate current is flowing negatively, and a dotted line 23B indicates a gate current waveform in the case of the short-circuiting from a state where the gate current is 0.

In the case of the short-circuiting from the gate current of 0, the gate current becomes I6 at the time t2 of the detection period T1, and the current I6 is compared with the reference current Igr. Since I6<Igr holds, the short-circuiting is decided. Next, there will be explained a short-circuiting decision in the case where the short-circuiting has occurred in the state in which the gate voltage remains. In the case where the detection period is set at T2 (initial end time t0–terminal end time t1), the gate current becomes "I4" at the time t1 of the detection period T2, and the current I4 is compared with the reference current Igr. In the case where the detection period is set at T1, a gate current I5 at the time t2 is compared with the reference current Igra. The gate current becomes smaller than the reference current as I4<Igr or I5<Igra, so that the short-circuiting is decided.

As stated above, in the case where the gate voltage has not fallen to the predetermined voltage at the turn-ON of the IGBT, at least one of the gate current detection period and the reference current is endowed with a gate-voltage dependency, whereby any erroneous sensing is avoided, and the abnormality of the IGBT can be correctly sensed.

Embodiment 4

Next, Embodiment 4 of this invention will be described.

Figure 24:
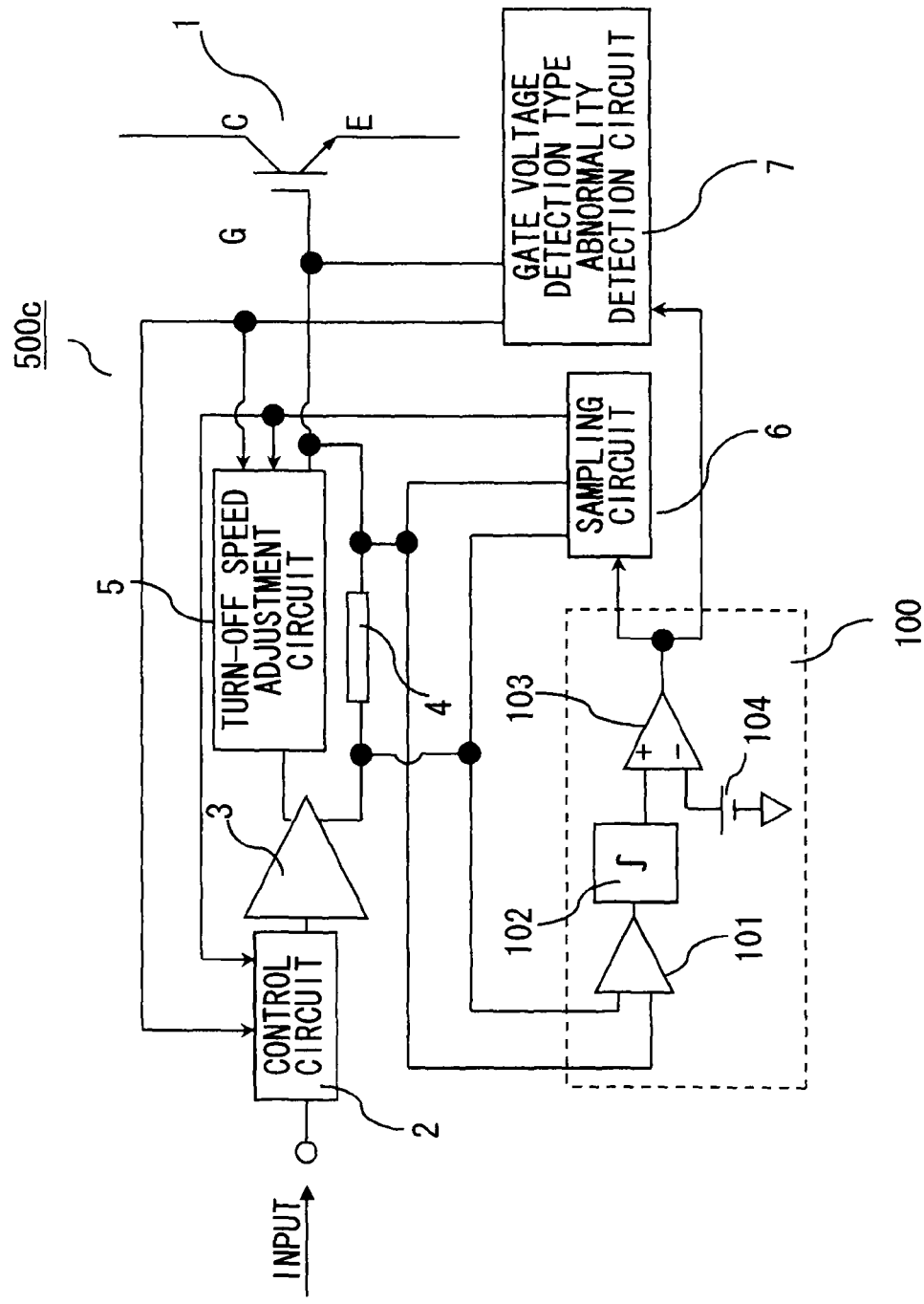
[FIG. 24] It is a configuration diagram showing a drive circuit for a power semiconductor element according to Embodiment 4 of this invention.

FIG. 24 is a configuration diagram showing a drive circuit 500c for a power semiconductor element according to Embodiment 4. In FIG. 24, the same numerals and signs as in FIG. 10 in Embodiment 1 stated before designate identical or equivalent portions, and they shall therefore be omitted from description.

A gate charge detection circuit 100 is configured of a differential amplifier 101, an integral circuit 102, a comparator 103, and the reference voltage source 104 of the comparator 103. A current flowing into a gate resistor 4 is detected by the differential amplifier 101, and it is converted into gate charges by integrating the detection value by the integral circuit 102. In addition, a voltage proportional to the gate charges and the voltage of the reference voltage source 104 are compared in the comparator 103. If the voltage proportional to the gate charges is smaller than the voltage of the reference voltage source 104, a sampling circuit 6 outputs a period for which a controlled variable is detected. The controlled variable is detected by a gate voltage detection type abnormality detection circuit 7, and any abnormality of the IGBT 1 is detected in accordance with criteria stated in Embodiment 1. Alternatively, the abnormality may be detected by the gate current detection type abnormality detection circuit 7a stated in Embodiment 3, in substitution for the gate voltage detection type abnormality detection circuit 7.

Figure 25:
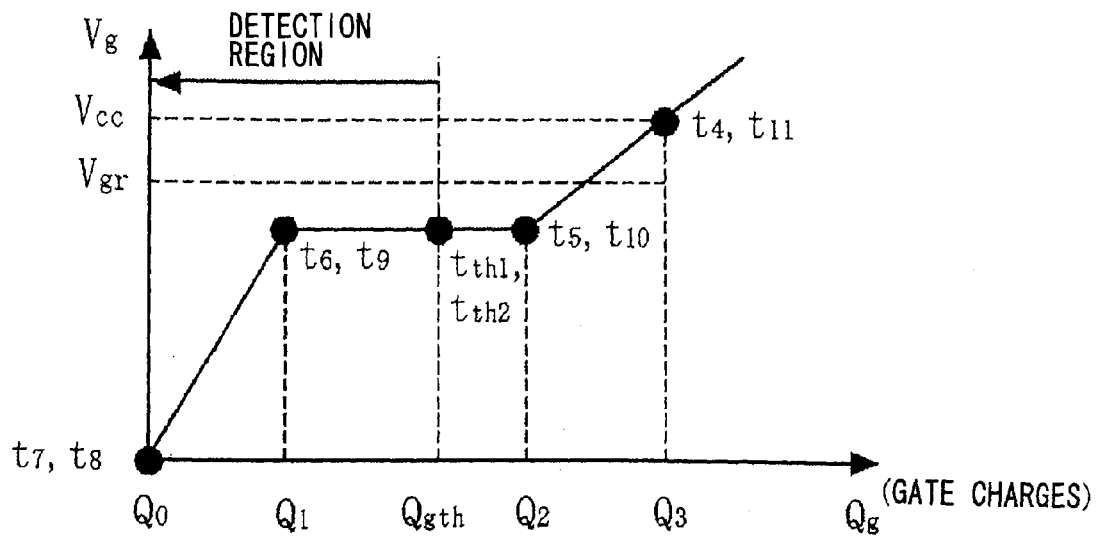
[FIG. 25] It is an explanatory diagram showing the relationship between gate charges Qg and a gate voltage Vg and a detection region in Embodiment 4 of this invention.
Figure 26:
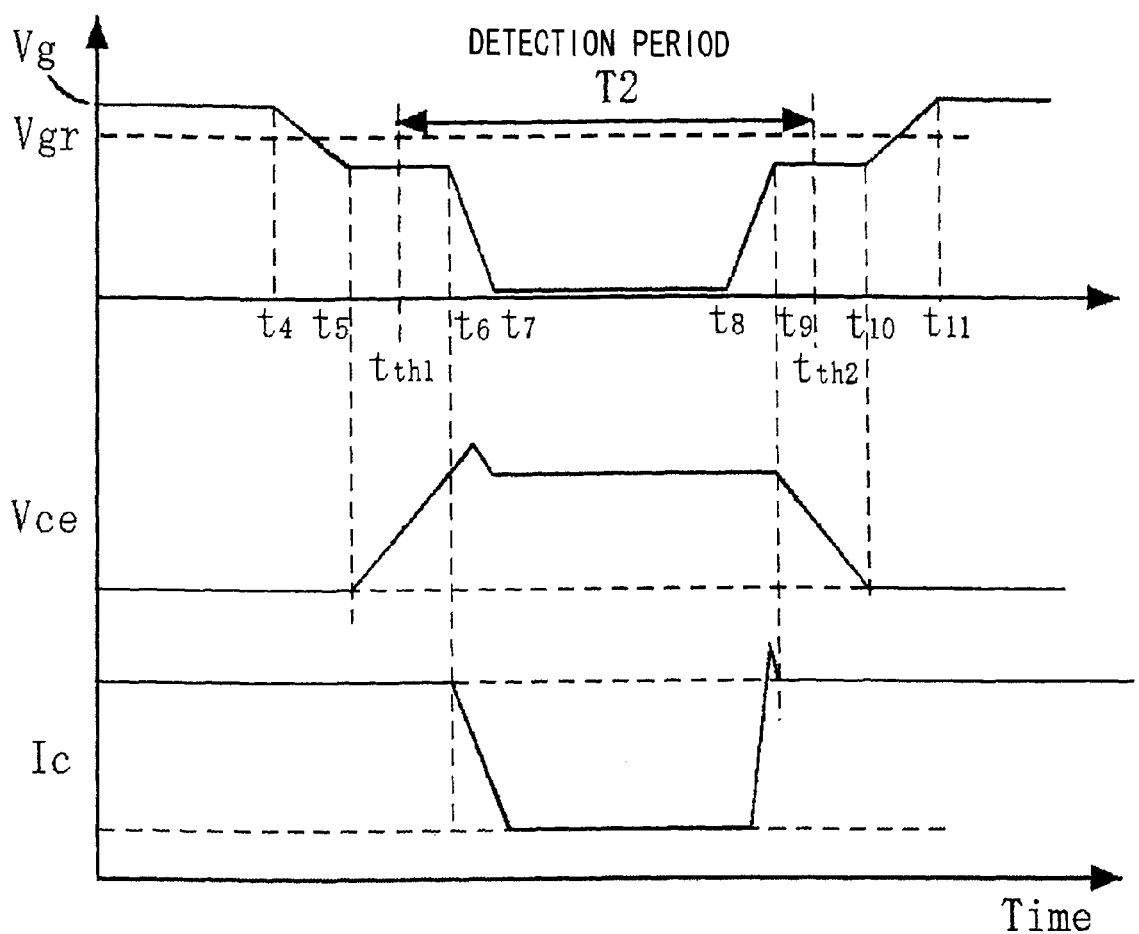
[FIG. 26] It is an explanatory diagram showing a detection period on a time axis in Embodiment 4 of this invention.

How to determine the detection period will be explained with reference to FIG. 25. FIG. 25 shows the relationship between the gate charges Qg and the gate voltage Vg. Besides, a gate voltage waveform on a time axis is shown in FIG. 26. A point which corresponds to times t4 to t11 in FIG. 26, is indicated in FIG. 25. In FIG. 26, "Vg" denotes the gate voltage, "Vice" the voltage between a collector terminal and an emitter terminal, and "Ic" a collector current.

As shown in FIGS. 25 and 26, the gate charges are Q3 at the time t4 at which the IGBT 1 is completely "ON". A turn-OFF operation begins from here, and the gate charges are discharged to Q2 at a time t5. Thereafter, a mirror period begins, and the gate charges are discharged to Q1 at a time t6 with the gate voltage Vg held substantially constant. Thereafter, the gate voltage Vg begins to lower again, and at a time t7, the gate voltage Vg becomes 0, and also the gate charges become Q0=0. Subsequently, when an "ON" signal enters into a control circuit 2 at a time t8, the gate voltage Vg begins to rise, and the gate charges are charged to Q1 at the start time t9 of a mirror period. Thereafter, the mirror period begins, and the gate charges are charged to Q2 at a time t10 with the gate voltage Vg held substantially constant. Thereafter, the gate voltage Vg begins to rise again, and at the time t11, the gate voltage Vg rises to the control supply voltage Vcc of a buffer 3, and the gate charges become Q3.

In order to detect the short-circuiting of the IGBT 1, the detection period is set as a period for which the gate charges are less than or equal to Qgth, and a threshold value for deciding the short-circuiting is denoted by "Vgr" in the case where the controlled variable is the gate voltage. The value Vgr is set at a voltage value between a mirror voltage (the gate voltage in the mirror period) and the supply voltage Vcc of the drive circuit. As shown in FIG. 25, in case of ordinary turn-ON, the gate voltage Vg does not exceed the value Vgr within a detection region, and hence, the short-circuiting is not erroneously detected. When the detection region in FIG. 25 is represented by a time axis, it becomes a detection period T2 as shown in FIG. 26.

Figure 27:
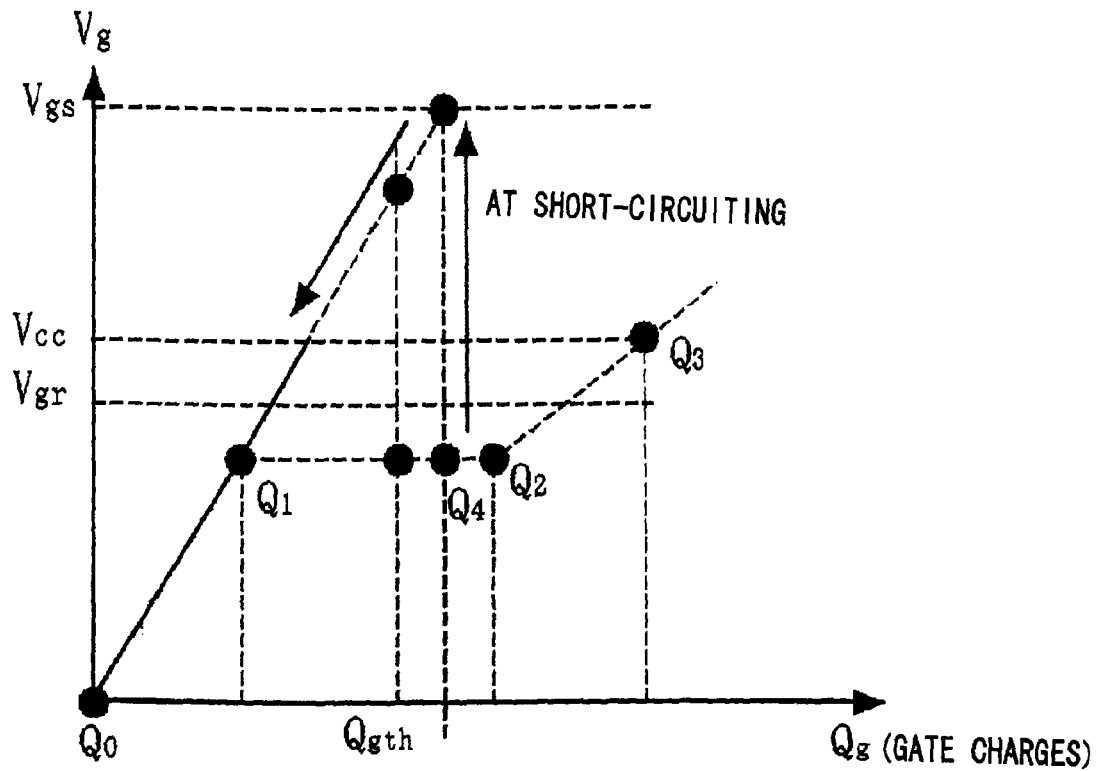
[FIG. 27] It is an explanatory diagram showing the changes of Vge and Qg at arm short-circuiting in Embodiment 4 of this invention.

The relationship between the gate charges Qg and the gate voltage Vg in the case of the occurrence of the short-circuiting is shown in FIG. 27. When the short-circuiting occurs, the mirror period shown in FIG. 25 disappears, and hence, the gate voltage Vg rises substantially in proportion to the gate charges Qg. The gate voltage Vg exceeds the value Vgr before the gate charges Qg become the gate charge reference value Qgth, so that the short-circuiting is sensible.

Next, there will be explained an operation in the case where the next "ON" command has entered in a state in which the gate voltage Vg has not lowered fully. In case of ordinary switching, the gate charges change as Q3→Q2→Q1→Q0→Q1→Q2→Q3 as shown in FIG. 25. In the case where the next "ON" command has entered in the state in which the gate voltage Vg has not lowered fully, the gate charges change as, for example, Q3→Q2→Q1→Q2→Q3. Even when the detection period is short, the same Qg-Vg characteristic curve as in the ordinary switching is demonstrated, so that when the sensing period and sensing level of the short-circuiting are set in terms of the gate charges Qg and the gate voltage Vg, the operation becomes normal without erroneously detecting the short-circuiting. Besides, the same holds true also of a Qg-Ig characteristic, so that when the sensing period and sensing level of the short-circuiting are set in terms of the gate charges Qg and the gate current Ig, the operation becomes normal without erroneously detecting the short-circuiting.

In the case of the short-circuiting, the gate voltage shifts from on the ordinary Qg-Vg characteristic curve to on a characteristic curve at the short-circuiting as shown in FIG. 27. In a case where the gate charges Qg at the time point of the short-circuiting are smaller than the reference value Qgth, the short-circuiting is sensed at a time point when the gate voltage Vg has become larger than the threshold value Vgr. In a case where the gate charges Qg(Q4) at the time point of the short-circuiting are larger than the reference value Qgth, the short-circuiting is not immediately sensed, but the gate voltage rises up to a short-circuiting gate voltage value Vgs as shown in FIG. 27. Since the short-circuiting gate voltage value Vgs is larger than the supply voltage Vcc, the gate charges Qg are discharged. In addition, at a time point when the gate charges Qg have become smaller than the reference value Qgth, the short-circuiting is sensed.

As stated above, in the case where the gate voltage has not lowered to the predetermined voltage at the turn-ON of the IGBT, the abnormality detection period is set to correspond to, at most, the gate charges Qgth, whereby the erroneous sensing is avoided, and the abnormality of the IGBT can be correctly sensed.

Embodiment 5

In the foregoing embodiments, substances on which the semiconductor elements are based have not been referred to, but the advantages of the present invention as explained above change depending upon the sorts of the substances. In this embodiment, there will be explained an advantage at the time when SiC (Silicon Carbide) is employed as the substance on which the semiconductor element is based.

Figure 28:
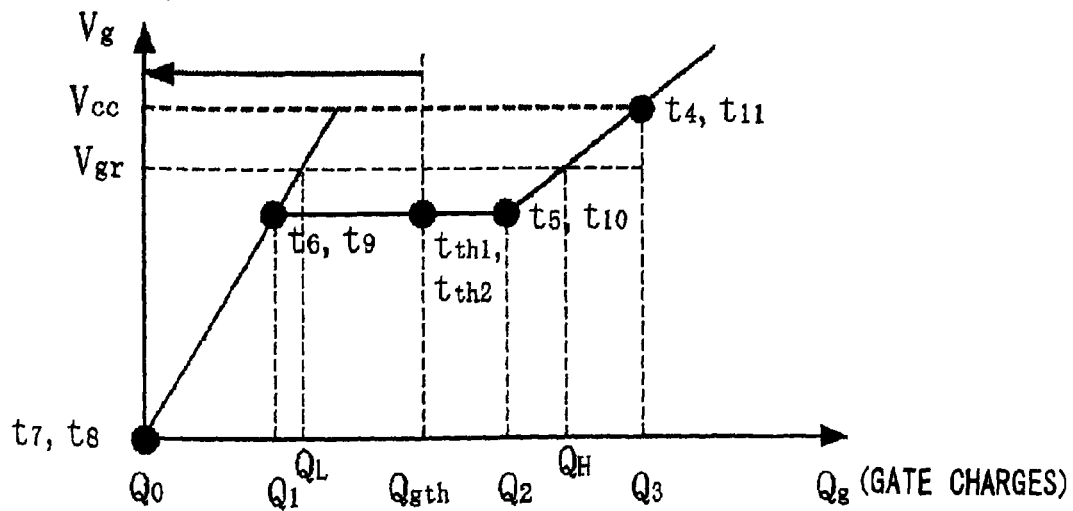
[FIG. 28] It is an explanatory diagram showing the relationship between gate charges Qg and a gate voltage Vg and a detection region in Embodiment 5 of this invention.

As compared with Si (Silicon) which is generally employed as a semiconductor substrate, the SiC exhibits a higher dielectric breakdown field and is therefore doped at higher concentrations. Accordingly, the capacitance between an anode (a drain terminal in a MOSFET, and a collector terminal in an IGBT) and a gate becomes larger in the MOSFET of the SiC than in the IGBT of the Si. A straight line which connects the point of charges Q0 and the point of the charges Q1 on the Qg-Vg characteristic curve in FIG. 25 as explained in Embodiment 4 is termed the "first straight line", and the charges of the intersection point between the first straight line and the reference voltage Vgr are denoted by "QL". Besides, a straight line which connects the point of the charges Q2 and the point of the charges Q3 on the Qg-Vg characteristic curve in FIG. 25 is termed the "second straight line", and the charges of the intersection point between the second straight line and the reference voltage Vgr are denoted by "QH". It is FIG. 28 that represents a situation on this occasion. In FIG. 28, in the section of the first straight line, a drain-source voltage is high, and hence, a drain-gate capacitance is small. Therefore, a gate-source capacitance is predominant as the input capacitance, and the gradient of the straight line of the Qg-Vg characteristic is determined by the gate-source capacitance. In the section of the second straight line, the drain-source voltage is low, and hence, the drain-gate capacitance becomes large. Therefore, the input capacitance becomes the sum of the gate-source capacitance and the drain-gate capacitance, and the gradient of the second straight line of the Qg-Vg characteristic is determined by the gate-source capacitance and the drain-gate capacitance. These straight lines are characteristics which pass through the origin. Therefore, as the difference of the gradients is larger, the difference of the charges QL and QH becomes larger, and an allowance increases against the variance of the reference value Qgth, so that the abnormality of the MOSFET can be sensed more reliably. Since the SiC is larger in the drain-gate capacitance as compared with the Si, the gradient of the second straight line becomes gentler, and the difference of the charges QL and QH becomes larger. Accordingly, when the SiC is employed as the semiconductor element, the abnormality of the MOSFET being the semiconductor element can be sensed more reliably.

Besides, when a capacitor is added between the drain and the gate even by employing the Si, without employing the SiC as the material of the MOSFET, a feedback capacitance enlarges for the input capacitance, and hence, a similar advantage is obtained.

INDUSTRIAL APPLICABILITY

This invention can be applied as a drive circuit for a semiconductor element sensing any abnormality of the power semiconductor element, for example, an IGBT or a MOSFET.

The invention claimed is:
1. A drive circuit for a semiconductor element, comprising:
a control circuit which turns "ON" and "OFF" the semiconductor element in correspondence with "ON" and "OFF" signals from outside, respectively;
a sampling circuit configured to receive an input of the "ON" signal from the control circuit and an input of a signal directly from a gate of the semiconductor element, and configured to determine a time period in which a detection process is permitted for a controlled variable of the semiconductor element, the time period being determined based on the input of the "ON" signal and the input of the signal directly from a gate of the semiconductor element, wherein the determined time period is a period that corresponds to a controlled variable Qon of the semiconductor element at a time point when said control circuit has inputted the "ON" signal; and
a controlled-variable detection circuit which receives an input of the determined time period from the sampling circuit and compares a controlled variable Qt of the semiconductor element as is detected within the determined time period, and a controlled-variable comparison value Qs that is set beforehand, thereby to output an abnormality occurrence signal for the semiconductor element.

2. A drive circuit for a semiconductor element according to claim 1, wherein the controlled-variable comparison value Qs is set in correspondence with the controlled variable Qon of the semiconductor element at the time point when said control circuit has inputted the "ON" signal.

3. A drive circuit for a semiconductor element, comprising:
a control circuit which turns "ON" and "OFF" the semiconductor element in correspondence with "ON" and "OFF" signals from outside, respectively;
a sampling circuit configured to receive an input of the "ON" signal from the control circuit, and configured to determine a time period in which a detection process is permitted for a controlled variable of the semiconductor element, only within a preset period, based on the input of the "ON" signal from the control circuit; and
a controlled-variable detection circuit configured to receive an input of the determined time period from the sampling circuit, the input of the "ON" signal from the control circuit and an input of a signal directly from a gate of the semiconductor element, and configured to compare a controlled variable Qt of the semiconductor element as is detected within the determined time period, and a controlled-variable comparison value Qs that is set in correspondence with a controlled variable Qon of the semiconductor element at a time point when said control circuit has inputted the "ON" signal, thereby to output an abnormality occurrence signal for the semiconductor element.

4. A drive circuit for a semiconductor element according to claim 3, comprising a controlled-variable estimation circuit which estimates the controlled variable of the semiconductor element by using a control signal from said control circuit, thereby to estimate the controlled variable Qon of the semiconductor element at the time point when said control circuit has inputted the "ON" signal.

5. A drive circuit for a semiconductor element, comprising:
a control circuit which turns "ON" and "OFF" the semiconductor element in correspondence with "ON" and "OFF" signals from outside, respectively;
a gate charge detection circuit which detects a gate charge quantity of the semiconductor element;
a sampling circuit configured to receive an input of a signal from the gate charge detection circuit, and configured to determine a time period in which a detection process is permitted for a controlled variable of the semiconductor element, only within a period when the gate charge quantity detected by said gate charge detection circuit is less than or equal to a predetermined value; and
a controlled-variable detection circuit which receives an input of the determined time period from the sampling circuit and compares a controlled variable Qt of the semiconductor element as is detected within the determined time period, and a controlled-variable comparison value Qs that is set between a controlled variable at a time when the semiconductor element lies in a mirror period and a controlled variable at a time when the semiconductor element is "ON", thereby to output an abnormality occurrence signal for the semiconductor element.

6. A driver circuit for a semiconductor element according to claim 5, comprising a turn-off speed adjustment circuit to which the signal of said controlled-variable detection circuit is inputted, and which turns off the semiconductor element at a speed lower than a turn-off speed in a normal mode, in a case where the abnormality occurrence signal has been inputted.

7. A drive circuit for a semiconductor element according to claim 5, wherein the controlled variable Qt is a gate voltage value.

8. A drive circuit for a semiconductor element according to claim 5, wherein the controlled variable Qt is a gate current value.

9. A drive circuit for a semiconductor element according to claim 5, wherein the semiconductor element is made from Si.

10. A drive circuit for a semiconductor element according to claim 5, wherein the semiconductor element is made from SiC.

11. A drive circuit for a semiconductor element according to claim 1, comprising a controlled-variable estimation circuit which estimates the controlled variable of the semiconductor element by using a control signal from said control circuit, thereby to estimate the controlled variable Qon of the semiconductor element at the time point when said control circuit has inputted the "ON" signal.

12. A driver circuit for a semiconductor element according to claim 1, comprising a turn-off speed adjustment circuit to which the signal of said controlled-variable detection circuit is inputted, and which turns off the semiconductor element at a speed lower than a turn-off speed in a normal mode, in a case where the abnormality occurrence signal has been inputted.

13. A drive circuit for a semiconductor element according to claim 1, wherein the controlled variable Qt is a gate voltage value.

14. A drive circuit for a semiconductor element according to claim 1, wherein the controlled variable Qt is a gate current value.

15. A drive circuit for a semiconductor element according to claims 1, wherein the semiconductor element is made from Si.

16. A drive circuit for a semiconductor element according to claim 1, wherein the semiconductor element is made from SiC.

17. A driver circuit for a semiconductor element according to claim 3, comprising a turn-off speed adjustment circuit to which the signal of said controlled-variable detection circuit is inputted, and which turns off the semiconductor element at a speed lower than a turn-off speed in a normal mode, in a case where the abnormality occurrence signal has been inputted.

18. A drive circuit for a semiconductor element according to claim 3, wherein the controlled variable Qt is a gate voltage value.

19. A drive circuit for a semiconductor element according to claim 3, wherein the controlled variable Qt is a gate current value.

20. A drive circuit for a semiconductor element according to claim 3, wherein the semiconductor element is made from Si.

21. A drive circuit for a semiconductor element according to claim 3, wherein the semiconductor element is made from SiC.

* * * * *